United States Patent
Furuno et al.

(10) Patent No.: US 6,742,701 B2
(45) Date of Patent: Jun. 1, 2004

(54) BUMP FORMING METHOD, PRESOLDERING TREATMENT METHOD, SOLDERING METHOD, BUMP FORMING APPARATUS, PRESOLDERING TREATMENT DEVICE AND SOLDERING APPARATUS

(75) Inventors: Masahiko Furuno, Iruma (JP); Tsugunori Masuda, Hanho (JP); Hideo Aoki, Yokohama (JP); Kazuhide Doi, Yokkaichi (JP)

(73) Assignees: Kabushiki Kaisha Tamura Seisakusho, Tokyo (JP); Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/161,566

(22) Filed: May 30, 2002

(65) Prior Publication Data

US 2003/0019917 A1 Jan. 30, 2003

Related U.S. Application Data

(63) Continuation-in-part of application No. 09/554,651, filed as application No. PCT/JP99/01956 on Apr. 13, 1999, now abandoned.

(30) Foreign Application Priority Data

Sep. 17, 1998 (JP) .......................................... 10-262195

(51) Int. Cl.⁷ ............................................... B23K 1/00
(52) U.S. Cl. ................................................. 228/205
(58) Field of Search ........................... 228/42, 33, 205, 228/206, 219, 223, 180.22, 220; 219/121.59, 121.36, 121.37, 121.38, 121.47; 315/111.21; 118/723 ME, 723 MW; 427/575; 204/170

(56) References Cited

U.S. PATENT DOCUMENTS 4,921,157 A * 5/1990 Dishon et al. ............ 228/124.1
6,089,445 A * 7/2000 Sindzingre et al. ......... 228/218

* cited by examiner

Primary Examiner—Tom Dunn
Assistant Examiner—Jonathan Johnson
(74) Attorney, Agent, or Firm—Darby & Darby

(57) ABSTRACT

Process gas is fed from a gas supply means to a plasma generating means in a vacuum chamber, and hydrogen-containing plasma is generated by the plasma generating means under a low pressure. A soft solder alloy on the surface of a workpiece supported by a workpiece exposing means is exposed to the hydrogen-containing plasma so that the soft solder alloy is irradiated with the hydrogen-containing plasma. Either simultaneously with or immediately after the plasma irradiation, the soft solder alloy undergoes reflow treatment in a vacuum by a heating means. As no flux is used, there is no need of a washing process, and the bump-shaped electrode terminals produced by using the inexpensive soft solder alloy on the surface of the workpiece have great reliability.

31 Claims, 19 Drawing Sheets

BUMP FORMING METHOD, PRESOLDERING TREATMENT METHOD, SOLDERING METHOD, BUMP FORMING APPARATUS, PRESOLDERING TREATMENT DEVICE AND SOLDERING APPARATUS

This application claims the priority of pending U.S. patent application Ser. No. 09/554,651, filed on Sep. 27, 2000, now abandoned, which is a 371 of PCT/JP99/01956 filed Apr. 13, 1999, which is hereby incorporated hereby by reference in its entirety.

BACKGROUND OF THE INVENTION

1. Field of the Invention

The present invention relates to a bump forming method for forming solder bumps that are intended to serve as mechanical and electrical connecting terminals, a method of conducting preliminary treatment before soldering (hereinafter called presoldering treatment) technically associated with said bump forming method, a soldering method grown from said presoldering treatment method, and apparatuses for employing these methods, such as a bump forming apparatus, a presoldering treatment apparatus and a soldering apparatus.

2. Discussion of the Related Art

Conventionally, a bare chip or a similar component having undergone a fine processing is packaged in such a way as to be easily mounted on a printed circuit board. The most typical example of such components are semiconductors. It has heretofore been common practice that an electrode pad portion of a bare chip is connected to an inner lead portion of a lead frame by a wire and sealed with a resin or ceramic material and that an outer lead portion extending to the outside of the chip serves as a mechanical and electrical connecting terminal to be connected to the packaging surface of the printed circuit board.

The rapidly increasing need recently to make electronic devices smaller, thinner, and lighter, as well as faster, has also made it necessary for the electronic components to be smaller and faster. For example, there has been an attempt to reduce the pitch between the leads of a Quad Flat Package (QFP), which is a semiconductor package provided with leads at the four sides of the package, from 0.65 mm to 0.4 mm. In order to cope with further reduction in the size of electronic equipment, vigorous efforts are being made to develop area-array packages of surface mount types.

An area array package is a package provided with electrodes that are arranged in a grid on the bottom of the package. Because of planar arrangement of the electrodes instead of a conventional linear arrangement, an area-array package is compact and provided with numerous pins. The design of connecting terminals for connecting an area array package to a printed circuit board has also changed from those attached to the lead frame to protrusion-shaped terminals (bumps) formed on the electrodes.

A change has also occurred in the wiring in a package, which used to be done with electrical wires; what is becoming necessary is flip chip joining using bumps formed on electrode portions. Such a change has been implemented, because the inductance component and other undesirable characteristics of a wire impair reduction of the operating speed and also cause various problems, such as improper functioning which is caused by simultaneous switching noises.

Examples of area array packages include a ball grid array (BGA), which may be used as a substitute for a QFP, and a chip scale package (CSP), which is reduced to a size nearly the same as a chip.

Furthermore, a part of the flip chip attaching (FCA) technique has already been put into practical use.

Terminals attached to the various electronic elements mentioned above are bump-shaped terminals instead of those of the conventional lead frame type. The most widely used are solder bumps, because they can cope with a batch reflow process, which is a part of the typical conventional procedure for production of a printed circuit board.

With regard to the bump forming technique, several methods have heretofore been offered. Those conventional methods are roughly divided into two categories: those using gold wires and those using solder alloys.

Examples of methods using gold wires include the Stud Bump Bonding (SBB) technique offered by Kyushu Matsushita Electric Co., Ltd. (*IEMT '93*: pp. 362–365, 1993) and the Press Contact technique offered by NEC Corp. (*Mate '97 Microjoining and Assembly Technology in Electronics*: pp. 15–18, 1997).

Both techniques call for a wire bonder to form gold bumps on the electrode side of a bare chip with a gold wire. With regard to connection of the chip to a substrate, the SBB technique calls for connection using silver paste, while the Press Contact technique calls for maintaining contact between the gold bumps and an electrode pad of the substrate solely by the contraction stress of the underfill resin.

Problems common to these techniques are:

(1) it takes too much time to form bumps, because bumps are formed one by one by studding an electrode pad of a bare chip with a gold wire by using a wire bonder;

(2) using expensive gold increases the cost per bump; and (3) as a batch reflow process with other surface mount components is impossible, each chip has to be individually mounted on a printed circuit board.

The Press Contact technique presents another problem in that a variance or insufficient accuracy in the height of gold bumps and the degree of surface smoothness of substrates have a considerable influence on obtaining reliable electrical connection, in other words the mounting efficiency, and may therefore present a serious problem in the yield of the product.

Regarding methods of using a solder alloy, a typical method calls for forming a solder bump by placing a solder ball having characteristics within standards on an electrode that is mounted on a bare chip and coated with a fusing agent (hereinafter called "flux"), and then conducting a reflow treatment. Solder balls for BGA are already available.

NEC Corp. has also offered a method of forming solder bumps by using the micropunching technique; this method calls for punching out a solder tape, placing solder pieces on an electrode that is mounted on a bare chip and coated with flux, and then conducting reflow treatment ('95 *Japan IEMT Symposium*: pp. 117–120).

Other examples include a solder paste printing method by Hitachi Techno Engineering Co., Ltd. (*Mate '97 Microjoining and Assembly Technology in Electronics*: pp. 19–22) and a plating method by TOSHIBA CORPORATION (*Mate '97 Microjoining and Assembly Technology in Electronics*: pp. 23–38).

All of the methods mentioned above call for, in some way or another, placing a solder alloy on an electrode pad and performing reflow to form solder bumps. Flux is always used for the reflow treatment and, thereafter, removed by washing.

In other words, according to any one of the methods of forming solder bumps, flux is indispensable and its washing process is accordingly necessary. Depending on its thoroughness, washing may produce flux residue, which may have a serious influence on the reliability of the finished electronic element.

For this reason, the washing process requires a vigorous cleaner, such as a Freon substitute. In addition to thus necessitating a process that will have an damaging effect on the environment, these methods present a problem of excessively high production costs in their requirement of an expensive facility and disposal of waste liquid.

There have been patent applications relating this field, such as those laid open under Provisional Publication Nos. 293952/1988, 148481/1989 and 500026/1993.

Japanese Patent Provisional Publication No. 293952/1988 describes a method of removing oxides from the surface of solder on an electrode portion by means of hydrogen plasma reduction when the solder is heated and melted in a vacuum.

However, hydrogen reduction damages a passivation film on a bare chip. Furthermore, using hydrogen presents the danger of explosion and requires proper measures to handle the exhaust, resulting in high production costs.

Japanese Patent Provisional Publication No. 148481/1989 describes a method of removing oxides by using argon plasma.

This method, however, is limed to cases of thermal bonding of a flat surface to another flat surface and not applicable to bump formation. Furthermore, a test has proved that treatment using argon plasma is unable to produce good bumps.

The method has another drawback in that the cost of the apparatus is very high, because the initial degree of vacuum in the chamber has to be considerably low: approximately $10^{-5}$ Torr. Furthermore, in case an oil diffusion pump is used, pollution by the oil will be a problem.

Japanese Patent Provisional Publication No. 500026/1993 describes a method that calls for fluorination of a solder surface by using fluorine-containing plasma in order to remove an oxide film that will impair wetting at the time of solder bonding.

However, fluorine plasma has the property of corroding silicon and a passivation film. Furthermore, silicon tetrafluoride, which is a reaction product, sometimes reacts with solder bumps and consequently damages the solder bumps. Fluorine residue may exert a serious influence on the reliability of the finished product, depending on the residual percentage.

In short, conventional methods that call for use of a gold wire require an excessively long processing period and high production costs and also present a problem in mounting a product on a substrate. Conventional methods using a solder alloy require use of flux and therefore present problems resulting from the postprocess washing. As for conventional methods involving plasma treatment, there is none that is suitable for forming solder bumps.

In order to solve the above problem, an object of the present invention is to provide a bump forming method and a bump forming apparatus for forming solder bumps serving as element electrode terminals that can cope with an electronic element having reduced dimensions. To be more specific, a bump forming method and a bump forming apparatus according to the invention are capable of forming such solder bumps with an inexpensive soft solder alloy and without using flux so that there is no need of postprocess washing and that finished solder bumps will have high reliability. Another object of the invention is to provide a presoldering treatment method and a presoldering treatment apparatus which are also capable of solving the above problems. Yet another object of the invention is to provide a soldering method and a soldering apparatus which are results of development from these methods and apparatuses.

SUMMARY OF THE INVENTION

A bump forming method according to the invention is a method of forming solder bumps, which will serve as connecting terminals, on the surface of an object (hereinafter called workpiece) by accumulating a soft solder alloy on the surface of the workpiece; irradiating the accumulated soft solder alloy with at least plasma that contains hydrogen; and applying reflow treatment to the soft solder alloy that has been irradiated with at least said plasma that contains hydrogen.

As hydroxides and oxides in the soft solder alloy are removed by irradiation of the accumulated soft solder alloy with hydrogen-containing plasma, bumps that will serve as mechanical and electrical connecting terminals are formed without the need of flux during the reflow treatment.

A bump forming method according to another feature of the invention is similar to the bump forming method described above and further characterized in that the reflow treatment and the hydrogen-containing plasma irradiation are conducted in a vacuum either simultaneously or with the reflow treatment following immediately after the hydrogen-containing plasma irradiation.

As a result, the quality of the product and the productivity can be increased. Conducting reflow treatment in a vacuum is especially effective in preventing re-oxidation of the soft solder alloy during the reflow. Conducting reflow treatment in a vacuum either simultaneously with or immediately after plasma irradiation enables the increase of the quality of the product and the productivity.

A bump forming method according to yet another feature of the invention is similar to either bump forming method of the invention described above and further characterized in that it calls for conducting the reflow treatment in either an inert gas atmosphere, such as a nitrogen atmosphere, or a reductive atmosphere.

As a result of this feature, the method is capable of preventing re-oxidation of the soft solder alloy during the reflow, thereby increasing the quality of the product.

A bump forming method according to yet another feature of the invention is similar to any one of the bump forming methods of the invention described above and further characterized in that it calls for irradiating the soft solder alloy with hydrogen-containing plasma at a temperature lower than the melting point of the soft solder alloy, the range of permissible temperature including room temperature.

As a result of this feature, the method is capable of clearly separating the process of plasma treatment to the soft solder alloy from the reflow process and ensuring proper execution of each process.

A bump forming method according to yet another feature of the invention is similar to any one of the bump forming methods of the invention described above and further characterized in that the process gas for generating the hydrogen-containing plasma is a mixed gas containing an inert gas and hydrogen gas that contains hydrogen with a mixing ratio of equal to or more than 3 V/V % but less than 8 V/V % calculated in terms of hydrogen molecules.

By using a mix that has been prepared by separately feeding an inert gas and either hydrogen gas or hydrogen-containing gas, or using a premixed gas, plasma irradiation is conducted. Using a process gas that is a mixed gas comprised of an inert gas to which hydrogen gas is added with a mixing ratio of equal to or more than 3 V/V % but less than 8 V/V % with respect to the total volume of the mixed gas not only achieves high plasma treatment effect (spattering effect) but is also desirable in view of safety, costs and other factors. Limiting the hydrogen content to not less than 3 V/V % ensures removal of hydroxides and oxides from the soft solder alloy, while limiting the hydrogen content to less than 8 V/V % ensures the safety and eliminates the need of treatment of exhaust gas.

Our tests have clearly proved that adding an excessive quantity of hydrogen to argon gas causes its plasma to selectively and severely etch a certain potion of the solder structure, i.e. the portion rich in tin, resulting in damage to the surface of the solder bumps. Therefore, it is desirable to limit the quantity of the hydrogen added to less than 10%.

A bump forming method according to yet another feature of the invention is similar to any one of the bump forming methods of the invention described above and further characterized in that the duration of the plasma irradiation is limited to less than two minutes. By plasma irradiation for less than two minutes, the method is capable of giving the soft solder alloy a sufficient quality improving treatment, thereby forming good solder bumps, and protecting the workpiece from possible damage.

A bump forming method according to yet another feature of the invention is similar to any one of the bump forming methods of the invention described above and further characterized in that the reflow treatment is conducted by means of heat radiation in a vacuum. By using heat radiation, the method ensures the effective reflow heating in a vacuum.

A bump forming method according to yet another feature of the invention is similar to any one of the bump forming methods of the invention described above and further characterized in that irradiation with fluorine-containing plasma is performed after irradiation with the hydrogen-containing plasma.

Because of this feature, the method is capable of limiting possible damage to a passivation film, which is a protective coat for a microcircuit formed on such a workpiece as a silicone wafer. For example, the method is capable of reducing etching of silicon oxide, silicon nitride, etc. or ashing of organic coats.

A bump forming method according to yet another feature of the invention is similar to the bump forming method described above and further characterized in that the fluorine-containing plasma contains either one of or both argon and oxygen.

Because of the fluorine-containing plasma irradiation conducted after the irradiation with the hydrogen-containing plasma, the method is capable of reducing the duration of the surface treatment and limiting damage to a passivation film.

A bump forming method according to yet another feature of the invention is similar to the bump forming method described above and further characterized in that the duration and the temperature of irradiation with fluorine-containing plasma are respectively limited to within 60 seconds and a temperature lower than the melting point of the soft solder alloy, the range of permissible temperature including room temperature.

By thus limiting the duration and the temperature of irradiation with fluorine-containing plasma, the method enables the quick surface treatment and the reduction of damage to passivation films.

A bump forming method according to yet another feature of the invention is similar to any one of the bump forming methods of the invention described above and further characterized in that the workpiece is preheated at a temperature not higher than 100° C. when conducting the reflow process.

As a result, it is possible to prevent the quality of the surface of the workpiece that has undergone surface treatment process from changing during the reflow process. Therefore, the method is capable of improving bonding between the bonding surfaces of the two objects where they are bonded to each other.

A bump forming method according to yet another feature of the invention is similar to any one of the bump forming methods of the invention described above and further characterized in that irradiation with hydrogen-containing plasma is performed again after the reflow process.

By performing plasma irradiation also after the reflow process, the minimal quantity of oxides or other impurities that appeared on the surface of the solder during the melting of the solder are removed. The method is thus capable of forming bumps that have cleaner surface.

A soldering method according to the present invention is a method that calls for bringing the soft solder alloy on the surface of a workpiece into contact with the surface of a bonding target, i.e. an object to which said workpiece is intended to be soldered, and thus bonding the surface of the workpiece to the surface of the bonding target by soldering during the reflow process of any one of the bump forming methods of the invention described above.

By thus bringing the surface of the soft solder alloy on the surface of the workpiece that has undergone surface reforming treatment into contact with the surface of the bonding target and heating them in the reflow process, the method enables the formation of bumps and bonding the workpiece and the bonding target together by soldering without using flux which would otherwise require post process washing.

A solder bump forming apparatus according to the present invention is adapted to use a soft solder alloy on the surface of a workpiece to form solder bumps, which will serve as connecting terminals, and includes a plasma generating means adapted to generate at least hydrogen-containing plasma under a low pressure; a gas supply means for feeding process gas to the plasma generating means; a workpiece exposing means for exposing the soft solder alloy on the surface of the workpiece at least to hydrogen-containing plasma; and a heating means for applying a reflow treatment the soft solder alloy in a vacuum.

By irradiating the soft solder alloy of the workpiece with hydrogen-containing plasma using the plasma generating means for generating hydrogen-containing plasma, the gas supply means for feeding process gas and the workpiece exposing means for exposing the workpiece to the hydrogen-containing plasma, the apparatus is capable of removing hydroxides and oxides from the soft solder alloy. Furthermore, by conducting the reflow process in a vacuum by the heating means, the apparatus is capable of preventing re-oxidation of the soft solder alloy during the reflow process.

A bump forming apparatus according to another feature of the invention is an apparatus as the bump forming apparatus described above, wherein the plasma generating means is provided with a high frequency power supply and an electrode for generating plasma, said electrode connected to the high frequency power supply and having a hollow electrode body adapted to receive the process gas, supply openings that are adapted to feed the process gas and bored in the end of the electrode body facing away from the workpiece, and through holes bored through the electrode body so as to extend from the end where the supply openings are formed to the opposite end.

Because of the structure described above, plasma ions generated from the process gas ejected from the supply openings, which are located opposite the workpiece, can be trapped and removed by the through holes, which serve as H tunnels for trapping plasma ions when the ions pass the through holes. By thus preventing a violent collision of ions with the workpiece, the apparatus is capable of protecting a passivation film or other parts of the workpiece from damage that is prone to be caused by hard, physical etching resulting from collision with ions. Meanwhile, active species that etch, when in the excited state, the workpiece through soft, chemical reaction are allowed to pass through the through holes and thus effectively utilized.

A bump forming apparatus according to yet another feature of the invention is an apparatus similar to either bump forming method of the invention described above and further characterized in that the heating means has a light source, which is adapted to heat the backside of the workpiece by radiation, and a reflecting mirror for adjusting luminous flux from the light source.

As a result of the structure that calls for heat radiation with the luminous flux from the light source adjusted by the reflecting mirror, the apparatus is capable of quick, intensive heating of the workpiece in a vacuum as well as easy temperature control.

A bump forming apparatus according to yet another feature of the invention is an apparatus as any one of the bump forming apparatuses of the invention described above and further characterized in that the apparatus includes a gas recovery means that defines the flow of the gas that carries plasma generated between said electrode and another electrode to the workpiece, said gas recovery means disposed such that the workpiece is positioned between the gas recovery means and the gas supply means.

As a result of the structure wherein the flow of the gas for carrying plasma or radicals (active species) generated between the aforementioned electrode and another electrode to the workpiece is defined by the gas supply means and the gas recovery means, which is disposed such that the workpiece is positioned between the gas recovery means and the gas supply means, the apparatus is capable of plasma irradiation with an increased efficiency.

A bump forming apparatus according to yet another feature of the invention is an apparatus as any one of the bump forming apparatuses of the invention described above and further characterized in that the heating means includes a light source and a reflecting mirror, said light source disposed at such a location so as not to be exposed to plasma and adapted to heat the workpiece by radiation, and said reflecting mirror adapted to form an optical path extending from the light source to the workpiece.

As a result of the structure described above, the apparatus is capable of preventing the plasma from inflicting damage to the light source or other components and also from causing chemical reduction.

A bump forming apparatus according to yet another feature of the invention is an apparatus as any one of the bump forming apparatuses of the invention described above and further characterized in that the apparatus includes a gas supply means for supplying a process gas, which is a mixed gas containing an inert gas and hydrogen gas that contains hydrogen with a mixing ratio of equal to or more than 3 V/V % but less than 8 V/V % calculated in terms of hydrogen molecules.

A gas containing hydroxyl groups is desirable to be used as the process gas. Taking such factors as the safety, costs and the like into consideration, a mixed gas comprised of an inert gas and hydrogen gas is most suitable. In view of effectiveness of the treatment, a mixed gas comprised of an inert gas to which hydrogen gas is added with a mixing ratio of equal to or more than 3% but less than 8% to the total volume of the mixed gas is particularly desirable. Limiting the hydrogen content to not less than 3 V/V % ensures the highly effective plasma treatment which is capable of effective removal of hydroxides and oxides from the soft solder alloy. Limiting the hydrogen content to less than 8 V/V % ensures the safety and eliminates the need of treatment of exhaust gas.

A bump forming apparatus according to yet another feature of the invention is an apparatus as any one of the bump forming apparatuses of the invention described above and further characterized in that the apparatus includes a high frequency power supply having a frequency of either 13.56 MHz or 2.45 GHz.

The process gas is excited and plasmatized by a 13.56 MHz or 2.45 GHz high frequency power supply, which is inexpensive and easily available.

A bump forming apparatus according to yet another feature of the invention is an apparatus as any one of the bump forming apparatuses of the invention described above and further characterized in that the plasma generating means is adapted to generate fluorine-containing plasma in addition to the aforementioned hydrogen-containing plasma, said fluorine-containing plasma containing either one of or both argon and oxygen.

As a result, the apparatus is capable of reducing possible damage to a protective coat formed on the workpiece and reforming the surface of such a protective coat. Therefore, the apparatus is more suitable for soldering and capable of bonding the soft solder alloy on the workpiece to the surface of the bonding target with increased reliability.

A soldering apparatus according to the invention includes a bump forming apparatus as any one of the bump forming apparatuses of the invention described above; a positioning means for aligning and bringing the soft solder alloy on the surface of a workpiece that has been exposed to plasma and the surface of a bonding target into contact with each other; and a heating means for applying reflow treatment to the film of the soft solder alloy, thereby soldering the surface of the workpiece and the surface of the bonding target together.

Therefore, by aligning and bringing the workpiece that has been treated with plasma and the bonding target into contact with each other by means of the positioning means and conducting a reflow process of the film of the soft solder alloy with the heating means, the soldering apparatus described above is capable of simultaneously performing both the bump forming process and the soldering process without using flux, use of which would necessitate postprocess washing.

A bump forming method according to yet another feature of the invention is a method of forming bumps, which will serve as connecting terminals, on the surface of a workpiece by following the procedure that comprises steps of roughening the surface of a soft solder alloy accumulated on the surface of the workpiece; giving the roughened surface of the soft solder alloy surface reforming treatment that calls for forming a fluorine containing layer on the surface of the soft solder alloy; and applying reflow treatment to the soft solder alloy that has undergone the surface reforming treatment.

A presoldering treatment method according to the invention is a pretreatment method that is intended to be performed prior to soldering of a workpiece and calls for roughening the surface of solder bumps of a soft solder alloy formed on the workpiece, and applying surface reforming treatment to the surface of the solder bumps by forming a fluorine containing layer on the roughened surface of the solder bumps.

A soldering method according to yet another feature of the invention is a method of bonding together a plurality of workpieces by soldering, said soldering method comprising the steps of roughening the surface of solder bumps of a soft solder alloy formed on one or more workpieces and applying surface reforming treatment to the surface of the solder bumps by forming a fluorine containing layer on the roughened surface of the solder bumps; and bringing said one or more workpieces having the solder bumps that have undergone the surface roughening treatment and the surface reforming treatment into contact with other workpiece or workpieces and, in this state, performing reflow of these workpieces. In this case, it does not matter whether any number of the said other workpieces have solder bumps that have undergone the surface roughening treatment and the surface reforming treatment.

The bump forming method, the presoldering treatment method and the soldering method described above are capable of preventing damage to a chip, a circuit board or the like by roughening the surface of the soft solder alloy and accordingly reducing the duration of the surface reforming treatment following the surface roughening treatment. Furthermore, because a fluorine containing layer formed as a result of surface reforming treatment provides increased solder wettability and prevents re-oxidation of the surface of the solder, there is no need of flux to conduct a reflow process or a postprocess washing process.

The surface roughening treatment in any one of the bump forming method, the presoldering treatment method and the soldering method described above is performed by using plasma excitation of an inert gas to which hydrogen has been added.

The quantity of the hydrogen added for said surface roughening treatment ranges from equal to or more than 3 V/V % to less than 8 V/V %.

Argon is used as the inert gas for said surface roughening treatment.

The surface reforming treatment in any one of the bump forming method, the presoldering treatment method and the soldering method described above is performed by using plasma excitation of a mixed gas which contains a fluorine compound or fluorine compounds, and to which either one of or both oxygen and argon are added.

The fluorine compound for said surface reforming treatment consists of at least one of the compounds selected from among carbon fluoride compounds, sulfur hexafluoride and nitrogen trifluoride.

A bump forming apparatus according to yet another feature of the invention includes a surface roughening device for roughening the surface of a soft solder alloy accumulated on a workpiece; a surface reforming device for performing surface reforming treatment by forming a fluorine containing layer on the roughened surface of the soft solder alloy; and a thermal melting unit for performing reflow of the soft solder alloy having the reformed surface, thereby forming solder bumps, which will serve as connecting terminals, on the surface of said workpiece.

A presoldering treatment apparatus according to yet another feature of the invention includes a surface roughening device for roughening the surface of solder bumps of a soft solder alloy formed on a workpiece, and a surface reforming device for performing surface reforming treatment by forming a fluorine containing layer on the roughened surface of the solder bumps.

A soldering apparatus according to yet another feature of the invention is adapted to solder together a plurality of workpieces and includes a surface roughening device for roughening the surface of solder bumps of a soft solder alloy formed on one or more workpieces; a surface reforming device for performing surface reforming treatment by forming a fluorine containing layer on the roughened surface of the solder bumps; and a thermal melting unit for bringing one or more workpieces having the solder bumps that have undergone the surface roughening treatment and the surface reforming treatment into contact with other workpiece or workpieces and, in this state, performing reflow of these workpieces.

The bump forming apparatus, the presoldering treatment apparatus and the soldering apparatus described above are each capable of preventing damage to a chip, a circuit board or the like by roughening the surface of the soft solder alloy accumulated on the workpiece or the surface of the solder bumps formed on the workpiece by means of the surface roughening device so as to reduce the time required for the surface reforming treatment performed thereafter. Furthermore, as a fluorine containing layer formed as a result of surface reforming treatment by the surface reforming device improves the solder wettability and prevents re-oxidation of the surface of the solder, there is no need of flux to conduct a reflow process by the thermal melting unit, and a postprocess washing process can be eliminated accordingly, even if a soft solder alloy is used.

According to yet another feature of the invention, the surface roughening device of any one of the bump forming apparatus, the presoldering treatment apparatus and the soldering apparatus described above is a plasma exciting device adapted to roughen the surface of a soft solder alloy by means of plasma excitation, and the plasma exciting device and the surface reforming device are respectively operated in separate and different atmospheres without a pause between operation of the plasma exciting device and the operation of the surface reforming device.

The feature described above enables the conduction of the surface roughening treatment and the surface reforming treatment in separate and different atmospheres without the possibility of the two types of treatments exerting any undesirable influence on each other.

According to yet another feature of the invention, the surface roughening device of the presoldering treatment apparatus and the soldering apparatus described above is adapted to roughen the surface of the solder bumps of a soft solder alloy in a mechanical way and has an ensured reliability.

The above and still further objects, features and advantages of the present invention will become apparent upon consideration of the following detailed description of a specific embodiment thereof, especially when taken in conjunction with the accompanying drawings, wherein like reference numerals in the various figures are utilized to designate like components, and wherein:

BRIEF DESCRIPTION OF THE DRAWINGS

The patent or application file contains at least one drawing executed in color. Copies of this patent or patent application publication with color drawing(s) will be provided by the Patent and Trademark Office upon request and payment of the necessary fee.

FIG. 1(A) is a sectional view of a first embodiment of a bump forming apparatus according to the present invention.

DETAILED DESCRIPTION OF THE PREFERRED EMBODIMENT

Figure 1A:
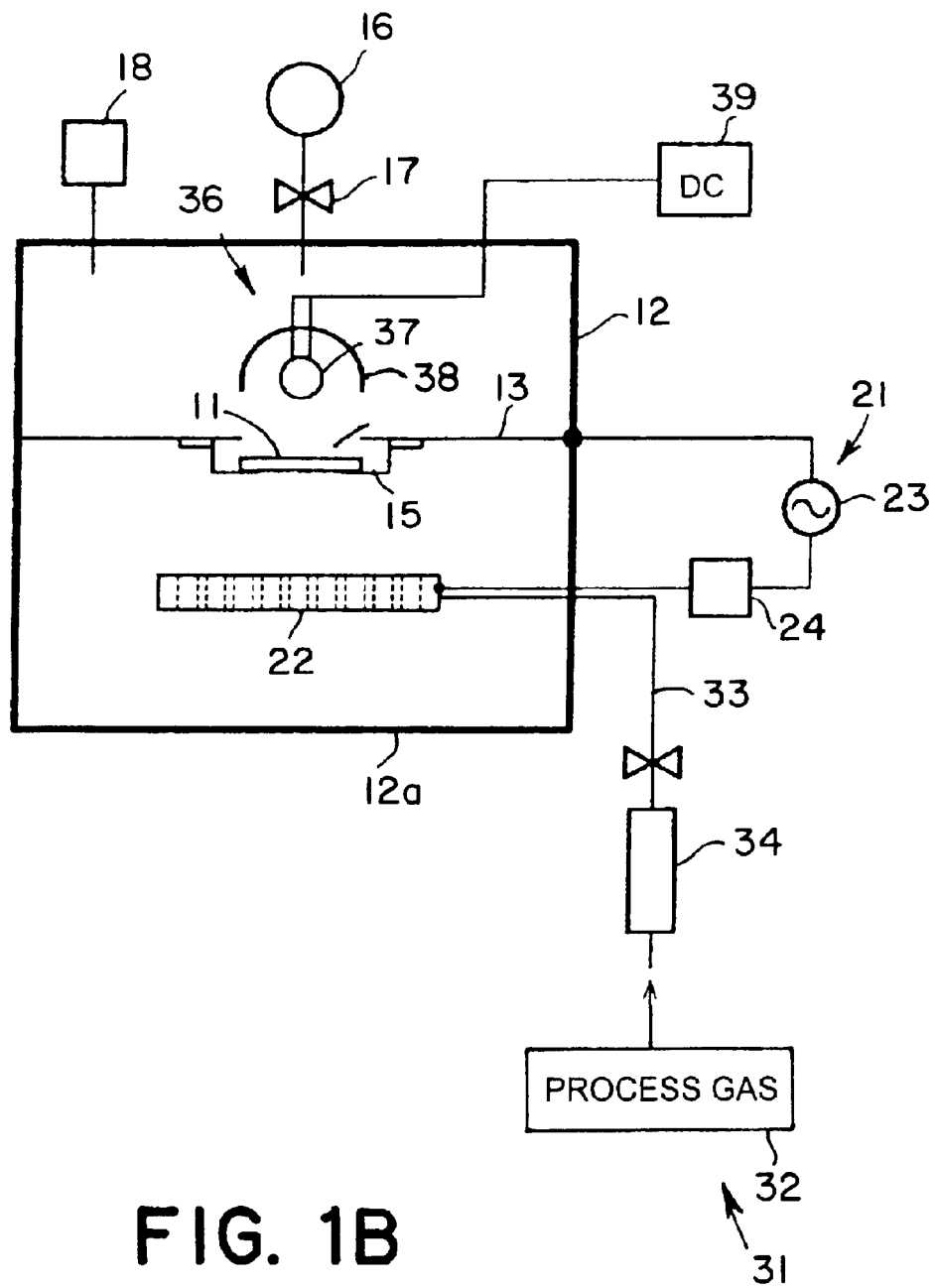
FIG. 1(B) is a fragmentary sectional view depicting the plasma flow produced with process gas in the electrode of the FIG. 1A apparatus.

FIG. 1(A) shows the first embodiment of a bump forming apparatus according to the present invention. Numeral 11 denotes a silicone wafer (a silicone substrate) as a workpiece. The silicone wafer 11 is formed by plating an aluminum electrode pad with eutectic solder, which serves as a soft solder alloy referred to in the claims and other part of the specification, with a metallized layer positioned between the aluminum electrode pad and the eutectic solder.

As shown in FIG. 1(A), a ground plate 13 is affixed to the middle portion of the wall of a vacuum chamber 12 as a mechanically integral body with the vacuum chamber 12 and electrically connected to said vacuum chamber 12. The vacuum chamber 12 can be airtightly sealed by inserting the silicone wafer thereinto.

An aperture 14 is formed at the center of the ground plate 13. The ground plate 13 is provided with a supporting jig 15 that serves as a workpiece exposing means for exposing to plasma the soft solder alloy on the surface of the silicone wafer 11. The supporting jig 15 is positioned around the lower edge of the aperture 14 so as to support the outer edge of the silicone wafer 11.

The workpiece exposing means does not solely consists of the supporting jig 15, which serves to support a workpiece at a fixed position, but also includes a carrier means for supporting and moving a workpiece during its plasma treatment.

A pressure reducing rotary pump 16 serving as a gas recovery means is connected to the vacuum chamber 12 via a throttle valve 17 adapted to adjust exhaust rate. A vacuum gauge 18 for measuring pressure in the vacuum chamber 12 is also connected to the vacuum chamber 12.

A plasma generating means 21 extends from the outside to the inside of the vacuum chamber 12. The plasma generating means 21 is adapted to generate plasma inside the vacuum chamber in the situation where the pressure in the vacuum chamber 12 has been reduced by the rotary pump 16.

The plasma generating means 21 is comprised of a thin, box-shaped electrode 22, a high frequency power supply 23, and a capacitive load matching unit 24. The electrode 22 is disposed in the vacuum chamber 12 in such a manner as to extend parallel with the bottom plate portion 12a of the vacuum chamber 12. One of the ends of the high frequency power supply 23 is connected to the electrode 22 via the capacitive load matching unit 24, while the other end of the high frequency power supply 23 is connected to the vacuum chamber 12. With the configuration as above, the plasma generating means 21 generates plasma mainly between the electrode 22 and the ground plate 13 or between the electrode 22 and the bottom plate portion 12a of the vacuum chamber 12.

The present embodiment calls for using plasma that contains hydrogen. If it is necessary, however, fluorine-containing plasma may be used in combination with hydrogen-containing plasma. The fluorine-containing plasma used is required to contain either one of or both argon and oxygen.

Figure 1B:
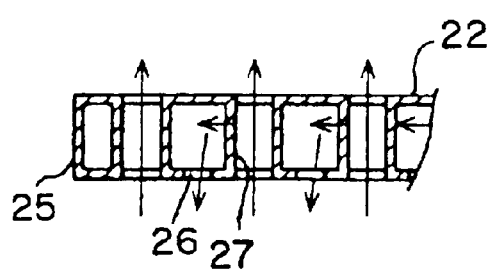

As shown in FIG. 1(B), the electrode 22 has a hollow electrode body 25 adapted to receive process gas. Supply openings 26 are bored in the bottom of the electrode body 25, i.e. the planar surface that faces away from the silicone wafer 11. Vertical through holes 27 are bored through the electrode body 25. The through holes 27 also serve as tunnels for trapping plasma ions.

A gas supply means 31 is provided in order to feed process gas to the electrode 22 of the plasma generating means 21 having the structure described above.

The gas supply means 31 includes a process gas source 32, a process gas supply pipe 33 and a mass flow controller 34. The process gas supply pipe 33 extends from the process gas source 32 and is connected to one of the ends of the hollow electrode 22 described above. The mass flow controller 34 is disposed in the process gas supply pipe 33 and serves to control the flow rate of the process gas.

The process gas fed from the process gas source 32 may desirably be a mixed gas that is a mixture of an inert gas and either hydrogen or gas containing hydrogen.

The aforementioned rotary pump 16, which serves as both a pressure reduction means and a gas recovery means, and the throttle valve 17 are disposed so that the silicone wafer 11 is positioned between the electrode 22, to which the process gas is fed, and the rotary pump 16, to which the throttle valve 17 is attached. The positional relationship between the electrode 22 and the rotary pump 16 defines the flow of the gas that carries to the silicone wafer 11 plasma or radicals generated mainly between the electrode 22 and the ground plate 13 or between the electrode 22 and the bottom plate portion 12a of the vacuum chamber 12.

A heating means 36 for performing reflow of the soft solder alloy of the

A heating means 36 for performing reflow of the soft solder alloy of the silicone wafer 11 is disposed above the silicone wafer 11.

The heating means 36 is comprised of a halogen lamp 37, a reflecting mirror 38 and a dc power supply 39 connected to the halogen lamp 37. The halogen lamp 37 serves as a light source for heating the backside of the silicone wafer 11 by radiation. The reflecting mirror 38 is disposed opposite the silicone wafer 11 with the halogen lamp 37 therebetween so as to adjust luminous flux from the halogen lamp 37.

In a first preferred embodiment, the rotary pump 16 reduces the pressure in the vacuum chamber 12 to within the range of 0.1 to 1 Torr. The silicone wafer 11 as the workpiece is an aluminum electrode pad plated with a eutectic solder with a metallized layer between the aluminum electrode pad and the eutectic solder. The silicone wafer 11 is securely supported by the supporting jig 15 formed as a part of the ground plate 13 so that the surface plated with the solder faces downward, in other words faces toward the electrode 22 connected to the high frequency power supply 23.

The electrode 22 is adapted to emit the process gas from the process gas supply openings 26, which are formed in the underside of the electrode 22, towards the bottom plate portion 12a of the vacuum chamber 12 located opposite the silicone wafer 11 with respect to the electrode 22. The vacuum chamber 12 is connected, together with the ground plate 13, to the high frequency power supply 23.

Numerous through holes 27 bored through the electrode 22 also serve as ion trapping H tunnels for trapping and removing plasma ions generated between the electrode 22 and the bottom plate portion 12a of the vacuum chamber 12 or other ions that may act as contaminants. As the plasma is generated between the electrode 22 and the ground plate 13 as well, the influence of ions remains to a small degree.

As described above, the numerous through holes 27 trap and eliminate plasma ions generated by the electrode 22 from the process gas that has been ejected from the supply openings 26 located at the end facing away from the silicone wafer 11. Therefore, the first embodiment described above prevents collision of ions with the silicone wafer 11, thereby protecting a passivation filming or other parts of the silicone wafer 11 from damage that is prone to be caused by hard, physical etching resulting from collision with ions.

Meanwhile, active species, i.e. excited radicals that etch the silicone wafer 11 by means of soft, chemical reaction, are allowed to pass through the through holes 27 of the electrode 22 and thus effectively utilized.

The process gas for generating plasma is a mixed gas that is a mixture of argon gas and either hydrogen gas or gas containing hydrogen. The process gas is fed from the supply openings 26, which are formed in the electrode 22, towards the bottom plate portion 12a of the vacuum chamber 12, with the flow rate of the process gas controlled by the mass flow controller 34, and flows upward through the through holes 27 of the electrode 22. The process gas then passes through the silicone wafer 11 and is discharged, by means of the rotary pump 16, from an exhaust port formed at the top of the vacuum chamber 12 through the throttle valve 17.

The pressure in the vacuum chamber 12 is adjusted through control of the gas flow rate performed by either one of or both the throttle valve 17 and the mass flow controller 34, while the vacuum gauge 18 monitors the pressure.

Plasma is generated by feeding electric power from the high frequency power supply 23 through the capacitive load matching unit 24 to the electrode 22.

After the silicone wafer 11 is irradiated with the plasma for a given period of time, supply of the process gas is terminated, and electric power is applied from the dc power supply 39 to the halogen lamp 37. Thus, the reflow process for heating the silicone wafer 11 by radiation begins.

During the reflow heating, the reflecting mirror 38 is so adjusted as to bring the light from the halogen lamp 37 to bear on the silicone wafer 11 uniformly.

It is desirable that the reflow process be performed by heating the silicone wafer 11 in a vacuum immediately after plasma irradiation, because doing so improves the quality of the product by preventing re-oxidation of the surface of the soft solder alloy, which would otherwise be caused by exposure to the atmosphere, and also improves the productivity by means of plasma irradiation in a vacuum and conducting reflow processes in succession.

Although there is a method that calls for conducting reflow heating by introducing an inert gas and performing convection heating, such a method presents various problems in that the device itself is heated; it requires an excessively long time to heat a workpiece; temperature control is difficult; and so forth. Therefore, it is desirable to conduct the heating process in a vacuum.

When the soft solder alloy with which the workpiece is plated is heated and melts, the minimal quantity of liquid contained in the soft solder alloy is gasified and discharged to the outside. Therefore, no voids, i.e. bubbles, remain in solder bumps formed through the process according to the invention.

After the solder has been melted by the reflow process, supply of electric power to the halogen lamp 37 is halted to cool the silicone wafer 11.

As a result, round solder bumps that will serve as connecting terminals are formed of the soft solder alloy on the surface of the silicone wafer 11.

When the temperature of the solder bumps has become lower than the solidus temperature, the pressure is increased to the initial level. This is to prevent the gas flow from causing deformation of the bumps.

As no flux is used as a fusing agent during plasma radiation or the reflow process described above, the method according to the embodiment does not necessitate a washing process nor present the danger of washing residue impairing the reliability of the product. Thus, the invention provides a method that imparts a less negative impact on the environment and enables the formation of bumps having an excellent quality.

By irradiating the solder bumps with hydrogen-containing plasma after the reflow process, the minimal quantity of oxides or other impurities that appeared on the surface of the workpiece when the solder was melted can be eliminated. Thus, bumps having cleaner surface can be obtained.

In the plasma irradiation process, the workpiece may be irradiated with plasma that contains fluorine after the irradiation with hydrogen-containing plasma. The fluorine-containing plasma contains either one of or both argon and oxygen. Furthermore, irradiation with the fluorine-containing plasma may desirably be performed for a period of no more than 60 seconds at a temperature lower than the melting point of the soft solder alloy, the range of permissible temperature including room temperature (normal temperature).

By performing irradiating with fluorine-containing plasma after irradiation with hydrogen-containing plasma, it is possible to reduce damage on passivation films, which are protective coatings formed on microcircuits on the surface of a silicone wafer 11 or other workpiece; in other words, it is possible to reduce etching of silicon oxide, silicon nitride, etc. or ashing of organic coats. It also becomes possible to reform the surface of the workpiece so as to be more appropriate for soldering, resulting in more reliable bonding of the soft solder alloy to the surface of a bonding target.

Limiting the duration of irradiation with fluorine-containing plasma to no more than 60 seconds and the temperature of the irradiation to less than the melting point of the soft solder alloy is especially beneficial in that it enables the quick surface treatment and the reduction of possible damage to passivation films.

During heating of the silicone wafer 11 by radiation, it is recommendable to conduct a preheat process immediately before the reflow process so that the silicone wafer 11 is preheated at a temperature less than 100° C. Thus preheating the silicone wafer 11 prevents the quality of the surface of the silicone wafer 11, which has been improved by the plasma irradiation, from deteriorating during the reflow process, and improves bonding between the surface of the silicone wafer 11 and the surface of another object.

Figure 2A:
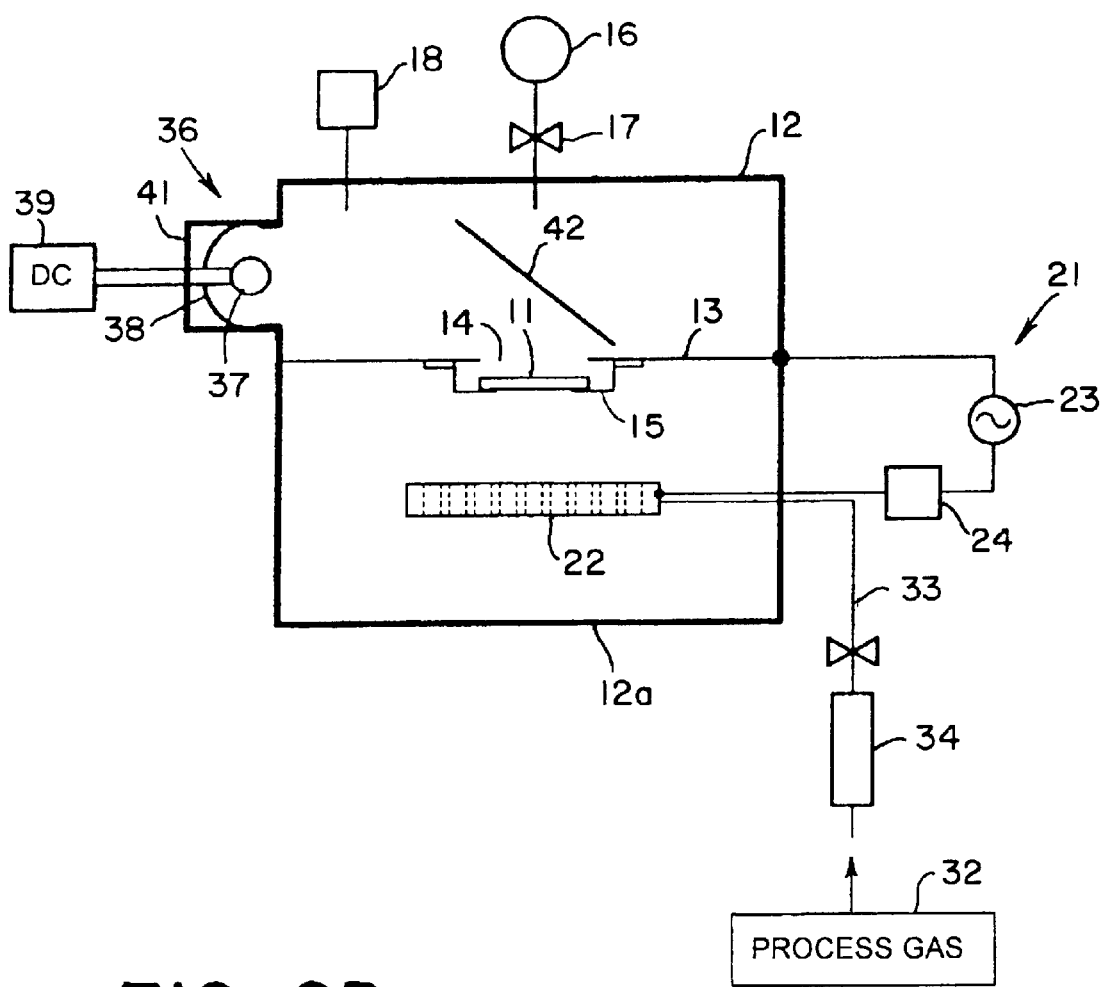
FIG. 2(A) is a sectional view of a second embodiment of a bump forming apparatus according to the present invention.
Figure 2B:
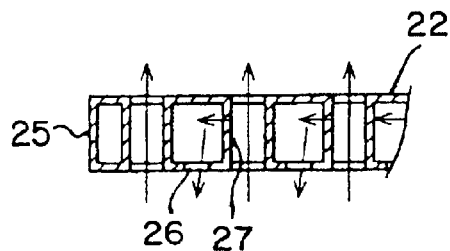
FIG. 2(B) is a fragmentary sectional view depicting the plasma flow produced with process gas in the electrode of the FIG. 2B apparatus.

FIG. 2(A) illustrates another embodiment of the present invention. As numerous elements are similar to those of the embodiment shown in FIG. 1(A), the elements corresponding to those of the embodiment shown in FIG. 1(A) are identified with the same reference numerals.

The halogen lamp 37 and the reflecting mirror 38 of the embodiment shown in FIG. 1(A) are disposed at a location where they are exposed to plasma. According to the embodiment shown in FIG. 2(A), however, an extended chamber 41 that is provided with a heating means 36 is formed at one of the side walls of the vacuum chamber 12, at a location near the top of the side wall and where it is not directly exposed to plasma.

The heating means 36 is comprised of a halogen lamp 37, a reflecting mirror 38, and a reflecting plate 42. The halogen lamp 37, which serves as a light source for heating the workpiece by radiation, and the reflecting mirror 38 are disposed in the extended chamber 41. The reflecting plate 42 is arranged in such a manner as to form an optical path that extends from the halogen lamp 37 to the silicone wafer 11, i.e. the workpiece. The optical path is adjusted by using the angle of the reflecting plate 42 so that light is radiated to the silicone wafer 11, which is supported at a fixed position, thereby heating the silicone wafer 11.

The feature of this embodiment lies in that it prevents hydrogen-containing plasma from causing damage to the halogen lamp 37 or insulator portions or chemical reduction which would exert an undesirable influence on the halogen lamp 37 or the insulator portions and that it also facilitates handling of parts in the vacuum chamber 12.

Figure 3:
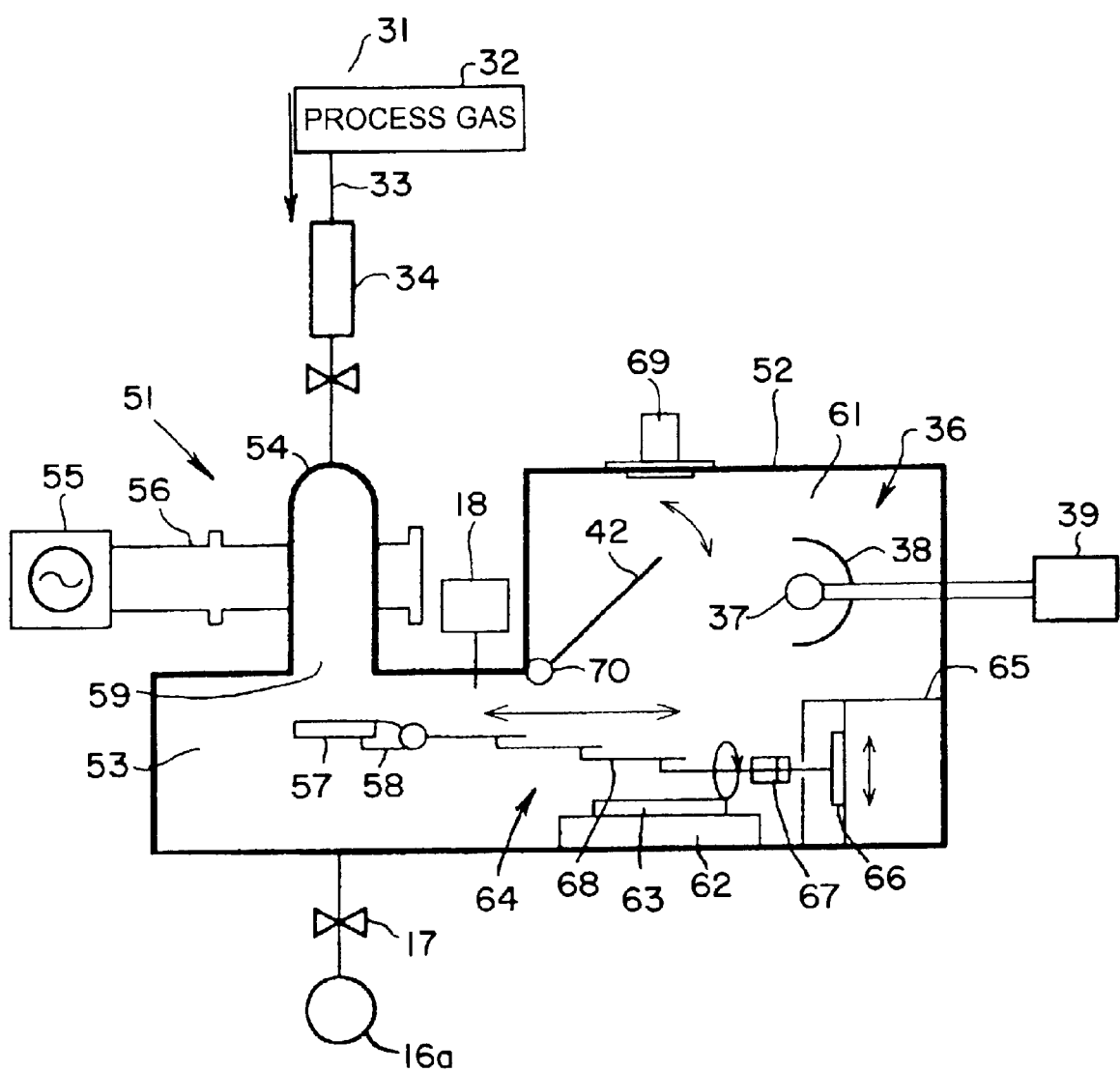
FIG. 3 is a sectional view showing a third embodiment of a bump forming apparatus and an embodiment of a soldering apparatus according to the present invention.

FIG. 3 illustrates a third embodiment of the present invention. The elements corresponding to those of the embodiment shown in FIG. 1(A) are identified with the same reference numerals.

The embodiment illustrated in FIG. 3 uses downflow microwave plasma. A plasma generating means 51 includes a plasma generating tube 54 that has a shape of an inverted U and is formed on top of a small chamber 53 of a vacuum chamber 52 as an integral body with the small chamber 53. A microwave power supply 55 serving as a high frequency power supply is connected to the plasma generating means 54 via a wave guide 56.

A gas supply means 31 intended for supply of process gas is disposed at the top of the plasma generating means 54. The gas supply means 31 includes a process gas source 32, a process gas supply pipe 33 extending from the process gas source 32 and connected to the plasma generating means 54, and a mass flow controller 34 disposed in the process gas supply pipe 33 so as to control the flow rate of the process gas.

A pressure reducing dry pump 16a serving as a gas recovery means is connected through a throttle valve 17 to the bottom of the small chamber 53, in other words the end opposite the plasma generating means 54. The internal pressure in the vacuum chamber 52 reduced by the dry pump 16a is measured by a vacuum gauge 18 protruding from the upper part of the small chamber 53.

A manipulator 58 serving as the workpiece exposing means supports a bare chip 57 as a workpiece at a position directly below the bottom opening 59 of the plasma generating means 54. The manipulator 58 serves to grip the bare chip 57 so as to expose the soft solder alloy on the surface of the bare chip 57 to plasma that descends from the plasma generating means 54.

The right hand portion of the vacuum chamber 52 is formed into a large chamber 61. A substrate holding base 62 is installed on the bottom of the large chamber 61. A substrate 63 serving as a bonding target, to which the bare chip 57 will be bonded, is supported on the substrate holding base 62.

The substrate holding base 62 is provided with a heating means (not shown) for preheating the substrate 63 prior to the reflow process and a cooling means (not shown) for cooling the substrate 63 after the reflow process.

A positioning means 64 for aligning the bare chip 57 that has been exposed to plasma with the substrate 63 and bringing the surfaces of the bare chip 57 and the substrate 63 into contact with each other is provided above the substrate 63.

The positioning means 64 is comprised of a main body 65, a vertical motion mechanism 66, a rotary mechanism 67, a telescopic mechanism 68 attached to the rotary mechanism 67, and the aforementioned manipulator 58, which is attached to the end of the telescopic mechanism 68. The main body 65 of the positioning means 64 is disposed at the bottom edge of the large chamber 61. The vertical motion mechanism 66 is installed in the main body 65 and adapted to be moved vertically by a fluid pressure cylinder or a feed screw mechanism. The rotary mechanism 67 adapted to be rotated by a motor or any other appropriate means is attached to the vertical motion mechanism 66. The telescopic mechanism 68 is adapted to be extended or contracted in the horizontal directions by means of a fluid pressure cylinder, a feed screw mechanism or the like.

By means of the positioning means 64, the bare chip 57 is moved, inverted and properly positioned between the lower end of the plasma generating means 54 and the top of the substrate 63.

The ceiling of the vacuum chamber 52 faces towards the substrate holding base 62 and the substrate 63. A charge coupled device camera (hereinafter called "CCD camera") 69 is mounted on the ceiling of the vacuum chamber 52 so as to face downward.

A heating means 36 is disposed in the large chamber 61 of the vacuum chamber 52. The heating means 36 is adapted to solder the surface of the bare chip 57 and the surface of the substrate 63 to each other by conducting reflow of the coating of the soft solder alloy on the bare chip 57 in the state where the bare chip 57 is aligned with the substrate.

The heating means 36 is comprised of a laterally positioned halogen lamp 37 serving as a light source for heating the back side of the bare chip 57 by radiation, a reflecting mirror 38 for adjusting the luminous flux, and a reflecting plate 42. The halogen lamp 37 is installed in the large chamber 61, where the lamp is prevented from exposure to plasma. The reflecting mirror 38 is disposed at the right hand side of the halogen lamp 37. The reflecting plate 42 is disposed at the left hand side of the halogen lamp 37 so as to form an optical path that is directed downward.

As the reflecting plate 42 is attached to the vacuum chamber 52 with hinges 70 so that the rotation of the reflecting mirror 42 can be adjusted, the optical path extending from the halogen lamp 37 to the bare chip 57 on the substrate 63 can be adjusted.

Next, the function of the embodiment shown in FIG. 3 is explained hereunder.

Although it is not shown in the drawings, the bare chip 57 is set on the substrate holding base 62 in the state that the bare chip 57 is aligned with the substrate 63 to which the bare chip 57 is intended to be bonded by reflow. At that time, the positional relationship between the bare chip 57 and the substrate 63 is ascertained by the CCD camera 69 installed at the upper portion of the vacuum chamber 52.

Thereafter, the bare chip 57 is gripped by the manipulator 58 and, in this state, transported by the vertical motion mechanism 66, the rotary mechanism 67 and the telescopic mechanism 68 to a plasma irradiation site located below the plasma generating tube 54 shown in FIG. 3.

Meanwhile, electric power transmitted from the 2.45 GHz microwave power supply 55 through the wave guide 56 excites the process gas that has been fed through the mass flow controller 34, thereby transforming the process gas into plasma. Thus, microwave plasma is generated.

The microwave plasma flows towards the bare chip 57 (down flow) and is then discharged through the throttle valve 17 located below the bare chip 57 to the outside of the system by the dry pump 16a. Throughout the treatment, the vacuum gauge 18 constantly monitors the internal pressure, and either one of or both the mass flow controller 34 and the throttle valve 17 keep adjusting the flow rate.

The bare chip 57 is exposed to the plasma with the surface having the soft solder alloy intended for solder bonding facing up so that the surface to which the soft solder alloy is bonded (hereinafter called the bonding surface) is improved in quality by the microwave plasma.

After the plasma radiation, the vertical motion mechanism 66, the rotary mechanism 67 and the telescopic mechanism 68 transport the bare chip 57 supported by the manipulator 58 to its initial position on the substrate 63, according to the initial value determined by the CCD camera 69.

After the positioning of the bare chip 57, the luminous flux emitted by the halogen lamp 37 that is connected to the DC power supply 39 is converged by the reflecting mirror 38 and reflected downward by the reflecting plate 42. The luminous flux thus oriented downward heats the bare chip 57 by radiation so that the plasma-treated bonding surface, which faces downward because the bare chip 57 has been inverted as explained above, is soldered to the substrate 63.

The reflecting plate 42 is allowed to rotate around the hinges 70 by a motor or any other appropriate means (not shown) so as to not hinder the CCD camera 69 from position confirmation. During the reflow process, the reflecting plate 42 can be rotated to such an angle as to irradiate the bare chip 57 with the luminous flux.

In a preferred embodiment, the substrate may be pre-heated before and cooled after the reflow by the heating means and the cooling means attached to the substrate holding base 62.

As described above, soldering is conducted by following a procedure that includes comprises plasma treating of the aforementioned soft solder alloy after ascertaining the position of the bare chip 57 in the vacuum chamber 52. Carrying the bare chip 57 to a position aligned with the substrate 63 to be soldered to the bare chip 57, and, in the state where the soft solder alloy of the bare chip 57 and the electrode portion of the substrate 63 are in contact with each other, heating the bare chip 57 and the substrate 63 by means of radiation from the direction of the bare chip. This heating will thereby melt the soft solder alloy to solder the bare chip 57 to the electrode portion of the substrate 63.

Should there occur slight misalignment between the bare chip 57 and the substrate 63 when the bare chip 57 is placed on the substrate 63 again, such a slight displacement is automatically adjusted during the reflow process by the self-alignment function of the melted solder.

As described above, the invention does not require flux to perform the reflow process, which is performed after a soft solder alloy is accumulated on the workpiece by plating or other means, and, therefore, enables the elimination of the flux washing process, which conventional methods require after formation of bumps.

Elimination of the flux washing process is possible, because the method according to the present invention calls for irradiation of the accumulated soft solder alloy with hydrogen-containing plasma to remove hydroxides and oxides, and conducting reflow process in a vacuum so as to prevent re-oxidation of the soft solder alloy during the reflow process.

Furthermore, by conducting the reflow process in the state where the bumps are in contact with surface of another object, the invention enables the soldering that does not necessitate flux.

As no flux is used during the solder reflow process for formation of solder bumps of a soft solder alloy, there is no need of flux washing process after the reflow process. By thus eliminating the possible presence of flux, the invention provides a highly reliable soldering method and an apparatus used for the method.

As reflow for soldering is conducted in the state where the bumps are in contact with surface of another object without using flux, the invention provides a highly reliable soldering method and an apparatus used for the method.

As to the method of accumulating soft solder alloy on the electrode pad, plating is more cost effective. However, a vapor deposition or other vacuum methods are also applicable. The soft solder alloy accumulated on the electrode pad by plating has a relatively porous structure that contains hydroxides and oxides. It is assumed that it also contains a minimal quantity of the plating solution.

It is also assumed that the hydroxides and oxides on the surface of the solder bumps can be removed by the physical force of spattering or by reduction resulting from irradiation with hydrogen-containing plasma under a reduced pressure of approximately 0.1 to 1 Torr.

There is no particular requirement as to the method of generating plasma. The workpiece may be exposed to plasma that has been generated by applying high frequency voltage to a pair of flat plates arranged in parallel, or, instead of being directly exposed to plasma, may be irradiated solely with radicals carried by the flowing gas. As another alternative, a plasma midway between the aforementioned may be used in order to take advantage of effect of ions to some extent.

The high frequency voltage has an appropriate frequency that may range from several tens of kHz to several GHz, and a plasma generating device corresponding to the frequency may recommendably be constructed. Generally speaking, a 13.56 MHz or 2.45 GHz power source is advantageous because of its easy availability.

There is no particular limitation to choice of the process gas provided that it has hydroxyl groups. Taking safety and production costs into consideration, however, a mixture of argon gas and hydrogen gas is appropriate. In view of the processing effect, a mixed gas produced by adding hydrogen gas to argon with a volume mixing ratio of equal to or more than 3 V/V % but less than 8 V/V % to the total volume of the mixed gas is desirable. Such a mixed gas presents no danger of explosion or the necessity of a special process to treat the exhaust gas.

As an alternative, a gas of other type may be used instead of hydrogen gas. Examples of such alternative gases include hydrocarbon gas, such as methane gas, silane gas, etc.

The reflow process may desirably be conducted by heating a workpiece in a vacuum immediately after the plasma irradiation. By doing so, it is possible to improve the quality of the product by preventing re-oxidation of the surface of the soft solder alloy, which re-oxidation would otherwise be caused by exposure to the atmosphere, and also improve the productivity by means of conducting the plasma irradiation in a vacuum and the reflow process either simultaneously or without a pause therebetween.

Although there is a method that calls for introducing an inert gas and performing convection heating, such a method presents various problems in that the device itself is inevitably heated; it requires an excessively long time to heat a workpiece; temperature control is difficult; and so forth. One of the most appropriate heating method is heat radiation, which calls for heating a workpiece by using a light source, such as a halogen lamp, a reflecting mirror for adjusting the luminous flux, and a reflecting plate for adjusting the optical path.

Although there are other types of light sources, such as xenon lamps, mercury lamps and far infrared radiation (IR) heaters, halogen lamps are more suitable, because they do not necessitate a special power supply and are able to heat a workpiece easily.

It is acceptable for the reflow process to be conducted simultaneously with plasma irradiation. It is also allowable to install a light-source protecting shutter (not shown) in front of the light source so as to keep the shutter closed to protect the light source during the plasma irradiation and, after the plasma treatment, conduct the reflow heating by the light source with the shutter open.

Instead of non-contact heating such as heat radiation, the workpiece may be heated by direct contact with a heating source. Although this may be done by attaching a heater to the sample table, such a method necessitates providing the sample table with a heating means and a cooling means. More recommendable for this reason is a method which calls for holding against the sample a jig that has been heated beforehand to a certain degree; heating the jig and the sample to the reflow temperature; holding the jig in that state for a given period of time; then removing the jig from the sample and letting the sample cool naturally. In case such a method is employed, however, temperature control that takes thorough consideration of the influence of thermal shock and heating/cooling of the jig is necessary.

The minimal quantity of liquid contained in the soft solder alloy is gasified and discharged to the outside during heating and melting the solder. Therefore, no voids, i.e. bubbles, remain in solder bumps that have been formed.

When the temperature of the solder bumps becomes lower than the solidus temperature, the pressure is increased to the initial level. This is to prevent the gas flow from causing deformation of the bumps.

As no flux is used for the process described above, the method according to the embodiment does not necessitate a washing process nor present the danger of washing residue impairing the reliability of the product. Thus, the invention provides a method that imparts a less negative impact on the environment and enables the formation of bumps having an excellent quality.

As a result of the second plasma irradiation, which is conducted after the reflow process, the minimal quantity of oxides or other impurities that appeared on the surface of the workpiece when the solder was melted can be eliminated so that bumps having cleaner surface can be obtained.

Soldering may be conducted, for example, by conducting plasma treating of the aforementioned soft solder alloy after ascertaining the position of the bare chip in the chamber. Carrying the bare chip to a position aligned with the substrate to be soldered to the bare chip. Lastly, in the state where the soft solder alloy of the bare chip and the electrode portion of the substrate are in contact with each other, heating the bare chip and the substrate by means of radiation from the direction of the bare chip, thereby melting the soft solder alloy to solder the bare chip and the electrode portion of the substrate to each other. Should there occur slight misalignment between the bare chip and the substrate, such a slight misalignment is automatically adjusted during the reflow process by the self-alignment function of the solder.

Figure 4:
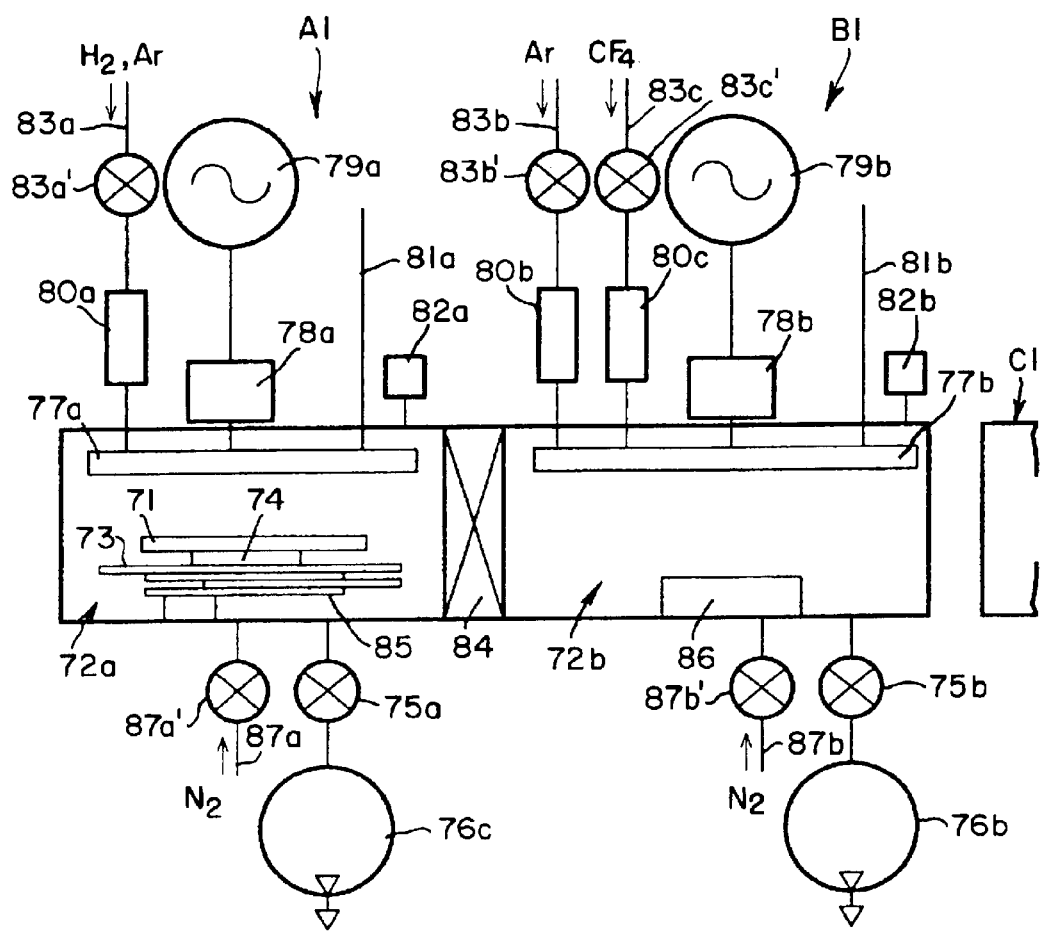
FIG. 4 is a sectional view showing a fourth embodiment of a bump forming apparatus and another embodiment of a soldering apparatus according to the present invention, wherein the soldering apparatus includes a presoldering treatment device adapted to perform presoldering treatment prior to soldering.

Next, referring to FIG. 4, the fourth embodiment of the present invention, which concerns formation of solder bumps on a silicone wafer, is explained. A metal tray 73 is disposed in a chamber 72a adapted to house a workpiece, i.e. a silicone wafer, 71. The metal tray 73 also serves as a counter electrode of the chamber 72a. A supporting jig 74 to hold the workpiece 71 is disposed on the metal tray 73.

Installed in the chamber 72a are a pressure reducing rotary pump 76a, which is connected to the lower part of the chamber 72a via a throttle valve 75a, and a shower electrode 77a, which is located at the upper part of the chamber 72a. A high frequency power supply 79a is electrically connected via a matching box 78a to the shower electrode 77a.

The shower electrode 77a is a hollow electrode having a tubular or box-like shape, and has numerous ejection holes bored in its underside. A mass flow controller 80a for controlling the gas feeding rate and a cooling water pipeline 81a for cooling the electrode are connected to the shower electrode 77a in such a manner that the mass flow controller 80a and the cooling water pipeline 81a respectively are electrically insulated.

A diaphragm gauge 82a for measuring the degree of vacuum in the chamber 72a is connected to the upper part of the chamber 72a. A gas supply pipeline 83a for feeding hydrogen-added inert gas, e.g. hydrogen-enriched argon gas, is connected to the mass flow controller 80a. A stop valve 83a' for opening or closing the pipe is disposed in the gas supply pipeline 83a.

Another chamber 72b is provided adjacent to the chamber 72a, with a partition shutter 84 disposed therebetween to separate the two chambers. The chamber 72a is provided with a carrier robot arm 85 for carrying the metal tray 73 to the other chamber 72b, while the chamber 72b is provided with a retaining table 86 for receiving the metal tray 73.

Connected to the lower part of the chamber 72a is a pressure return pipeline 87a that is adapted to introduce nitrogen gas into the chamber 72a in order to return the pressure in the chamber 72a to the atmospheric pressure. A pressure return valve 87a' for opening or closing the pipe is disposed in the pressure return pipeline 87a.

In the same manner as the chamber 72a, the other chamber 72b is provided with a throttle valve 75b, a rotary pump 76b, a shower electrode 77b, a matching box 78b, a high frequency power supply 79b, two lines of mass flow controllers 80b, 80c, a cooling water pipeline 81b, a diaphragm gauge 82b, two gas supply pipelines 83b, 83c, stop valves 83b', 83c', a pressure return pipeline 87b and a pressure return valve 87b'.

The components attached to the chamber 72a, such as the rotary pump 76a, the shower electrode 77a, the high frequency power supply 79a, the gas supply pipeline 83a and the pressure return pipeline 87a, constitute a surface roughening device A1, which is adapted to roughen the surface of the soft solder alloy accumulated on the conductor of the workpiece 71. The surface roughening device A1 is a plasma exciting device for roughening the surface of the soft solder alloy by exciting plasma.

The components attached to the other chamber 72b, such as the rotary pump 76b, the shower electrode 77b, the high frequency power supply 79b, the gas supply pipelines 83b, 83c and the pressure return pipeline 87b, constitute a surface reforming device B1, which is adapted to excite plasma so as to form a fluorine-containing layer on the surface of the soft solder alloy that has been roughened by the surface roughening device A1. The surface reforming device B1 thus serves to improve the roughened surface of the soft solder alloy.

Provided separately from the chambers 72a, 72b is a nitrogen atmosphere reflow furnace C1, which serves as a thermal melting unit for bonding the solder to a conductor by heating and melting the soft solder alloy whose surface has been roughened in the chamber 72a and reformed in the chamber 72b.

The nitrogen atmosphere reflow furnace C1 is adapted to heat and melt a soft solder alloy by exposing the soft solder alloy to far infrared, hot blast or the like in a nitrogen atmosphere, which is an inert gas.

The thermal melting unit is not limited to the nitrogen atmosphere reflow furnace C1; a vapor phase soldering machine, which is adapted to melt a soft solder alloy by using vapor latent heat of a vapor phase is also applicable.

Figure 5A:
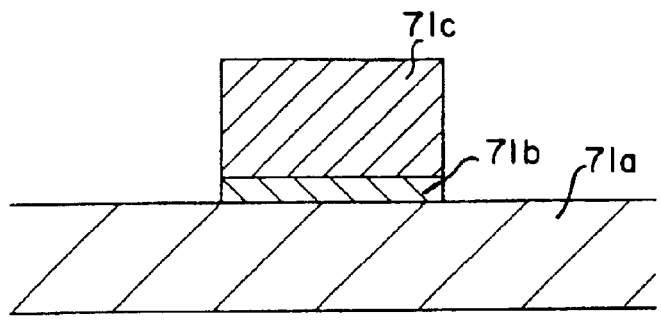
FIGS. 5(A)–5(D) are sectional views illustrating an embodiment of a pump forming method according to the present invention.

As illustrated in FIG. 5(A), a tin-lead (Sn—Pb) eutectic solder 71c serving as the soft solder alloy referred to in the claims and other parts of the specification is accumulated on a metallized layer 71b on the electrode of a silicone wafer 71a, i.e. a workpiece 71, by means of plating or vapor deposition.

Figure 5B:
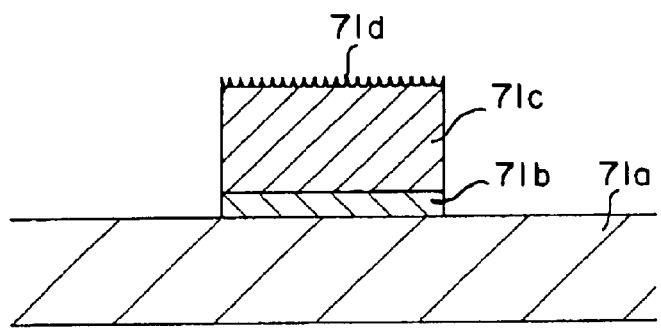

As illustrated in FIG. 5(B), the surface 71d of the Sn—Pb eutectic solder 71c is roughened by the surface roughening device A1. The surface roughening treatment is done in the chamber 72a by using a high frequency glow discharge of the hydrogen containing argon gas fed from the gas supply pipeline 83a to the shower electrode 77a.

Figure 5C:
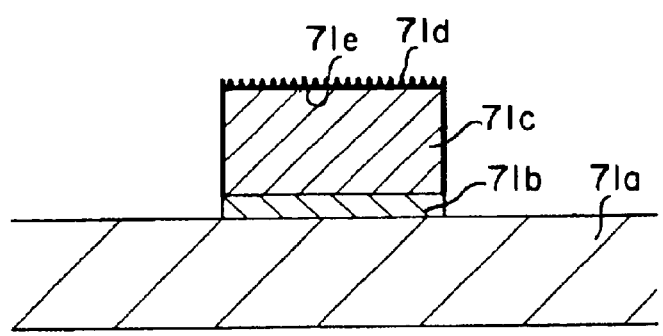

As illustrated in FIG. 5(C), the surface reforming treatment is conducted to the roughened surface 71d of the Sn—Pb eutectic solder 71c by the surface reforming device B1 so as to form a fluorine containing layer on the surface 71d. The surface reforming treatment is done in the other chamber 72b by using a high frequency glow discharge of the mixed gas that consists of argon (Ar) and carbon tetrafluoride ($CF_4$) fed from the gas supply pipelines 83b, 83c to the shower electrode 77b.

For the above process, mixing ratios of the hydrogen and the carbon tetrafluoride are 7 V/V % and 60 V/V % respectively. The treatment is conducted under pressure of 30 pascal (hereinafter abbreviated as Pa) by using 13.56 MHz high frequency power supplies 79a, 79b with an output power of 500 W. Duration of the surface roughening treatment is 60 seconds, while that of the surface reforming treatment is 30 seconds.

Figure 5D:
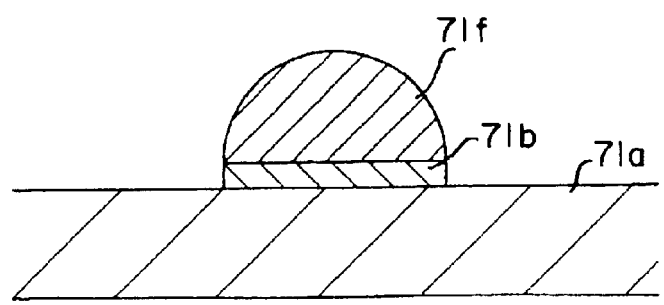

Thereafter, as shown in FIG. 5(D), the Sn—Pb eutectic solder 71c having the improved surface undergoes a reflow treatment in the nitrogen atmosphere reflow furnace C1 so that solder bumps 71f, which will serve as connecting terminals, are formed on the surface of the silicone wafer 71a.

Next, the function of the apparatus shown in FIG. 4 is explained in further detail.

The workpiece 71 is placed on the supporting jig 74 on the metal tray 73, which also serves as a counter electrode of the chamber 72a. The pressure in the chamber 72a is reduced by the rotary pump 76a via the throttle valve 75a. 13.56 MHz high frequency power is fed from the high frequency power supply 79a through the matching box 78a to the shower electrode 77a, which is disposed at the upper part of the interior of the chamber 72a.

The argon gas enriched with hydrogen is pushed into the gas supply pipeline 83a and fed into the chamber 72a through a plurality of holes bored in the shower electrode 77a, with the mass flow controller 80a controlling the flow rate of the gas.

The diaphragm gauge 82a monitors the degree of vacuum in the chamber 72a, and the internal pressure in the chamber 72a is adjusted by means of the throttle valve 75a. After surface roughening treatment, the stop valve 83a' is closed to stop the supply of hydrogen-enriched argon gas in order to reduce the internal pressure to 5 Pa or less.

Then, the partition shutter 84 that separates the chamber 72a from the adjacent chamber 72b is opened, and the metal tray 73 is transferred onto the retaining table 86 in the chamber 72b by the carrier robot arm 85.

After the transfer is completed, the carrier robot arm 85 is returned, and the partition shutter 84 is closed. Then, argon (Ar) gas and carbon tetrafluoride ($CF_4$) gas are fed from the gas supply pipelines 83b,83c through the mass flow controllers 80b,80c to the shower electrode 77b, through which the gases flow into the chamber 72b.

After the gas has become stable, a 500 W high frequency power is fed from the high frequency power supply 79b through the matching box 78b to the shower electrode 77b to generate a high frequency glow discharge, thus performing surface reforming treatment.

As surface roughening treatment and surface reforming treatment are thus performed separately in different atmospheric environments that are separated by the partition shutter 84, the system is free from the problem of two kinds of treatments exerting an undesirable influence on each other; for example, in case the carbon tetrafluoride that should be fed into the chamber 72b is mixed in a great quantity into the hydrogen-enriched argon gas fed into the chamber 72a for surface roughening treatment in the chamber 72a, it will cause generation of hydrogen fluoride (HF) and argon plasma, which is not desirable for surface roughening treatment. By means of the partition shutter 84, however, the embodiment described above is capable of preventing such an occurrence.

After the treatment, the pressure return valve 87b' is opened to introduce the nitrogen gas into the chamber 72b and return the pressure in the chamber to the atmospheric pressure, and the workpiece is then removed from the chamber 72b. Thereafter, the workpiece is heated in the nitrogen atmosphere reflow furnace C1 so that the soft solder alloy melted by the reflow is formed into solder bumps.

The heating temperature for the reflow must be higher than the melting point of the soft solder alloy, preferably in the range of 40 to 60° C. In case of the fourth embodiment, the workpiece was heated to 230° C., because Sn—Pb eutectic solder was used. The oxygen concentration in the nitrogen atmosphere reflow furnace C1 is 100 ppm.

Figure 6:
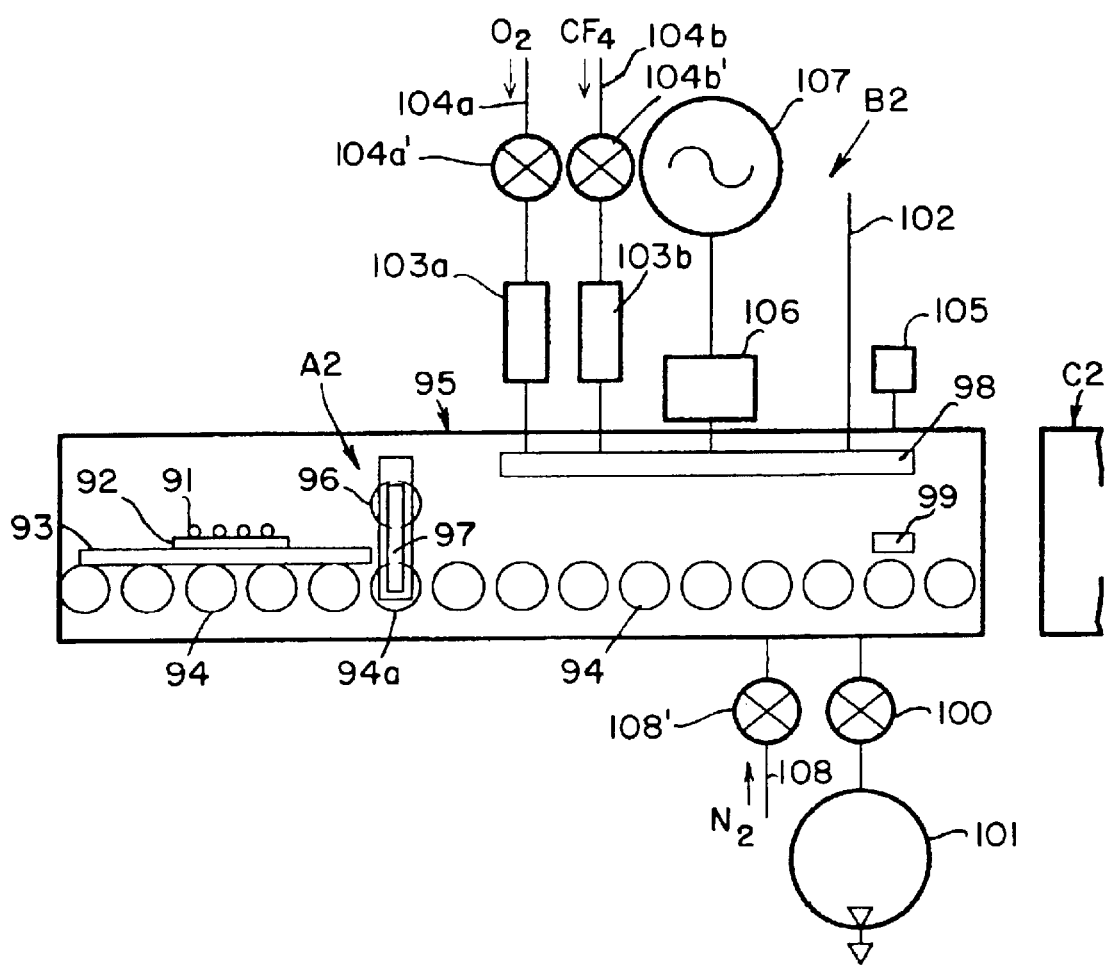
FIG. 6 is a sectional view of yet another embodiment of a soldering apparatus according to the present invention, which includes a presoldering treatment device adapted to perform pretreatment prior to soldering.

Next, the fifth embodiment of the present invention, which concerns soldering a silicone chip to an Sn—Pb eutectic solder bump, is explained hereunder. FIG. 6 illustrates the outline of an apparatus for treating solder bumps on a resin substrate. The workpiece, i.e. a resin substrate 92 having solder bumps 91, is placed on carrier rollers 94 with a metal tray 93 positioned therebetween. The metal tray 93 also serves as a counter electrode. The rollers 94 are arranged in a chamber 95, from an end of the chamber to the opposing end.

Disposed above one of the rollers 94 (the roller 94a) is a bump form adjusting roller 96, whose vertical position can be adjusted by an adjusting jig 97.

Also disposed in the chamber 95 are a shower electrode 98 and a sensor 99, both of which are located closer to one of the two lateral ends of the chamber than is the bump form adjusting roller 96 as viewed in FIG. 6. The shower electrode 98 is disposed closer to the top of the chamber 95, while the sensor 99, which is adapted to detect the metal tray 93, is located closer to the bottom of the chamber. A pressure reducing rotary pump 101 is connected to the lower part of the chamber 95 via a throttle valve 100.

A cooling water pipeline 102, which serves to cool the electrode, and two lines of mass flow controllers 103a,103b for respectively controlling the feeding rates of gases are connected to the shower electrode 98 in such a manner that the mass flow controllers 103a,103b and the cooling water pipeline 102 respectively are electrically insulated.

Gas feeding pipelines 104a,104b are respectively connected to the mass flow controllers 103a,103b, and stop valves 104a',104b' are respectively disposed in the gas feeding pipelines 104a,104b so as to open or close the corresponding pipelines. In case a premixed gas is used, the gas feeding pipelines 104a,104b may be united into a single pipeline.

A diaphragm gauge 105 for measuring the degree of vacuum in the chamber 95 is connected to the upper part of the chamber 95. A high frequency power supply 107 is electrically connected via a matching box 106 to the shower electrode 98.

Connected to the lower part of the chamber 95 is a pressure return pipeline 108 that is adapted to introduce nitrogen gas into the chamber 95 in order to return the pressure in the chamber 95 to the atmospheric pressure. A pressure return valve 108' for opening or closing the pipe is disposed in the pressure return pipeline 198.

The components installed in the chamber 95, such as the carrier roller 94a, the bump form adjusting roller 96 and the adjusting jig 97, constitute a surface roughening device A2, which is adapted to mechanically roughen the surface of the soft solder alloy accumulated on the conductor of the workpiece 71.

Of the other components attached to the chamber 95, the shower electrode 98, the rotary pump 101, the gas supply pipelines 104a,104b, the high frequency power supply 107, the pressure return pipeline 108, etc. constitute a surface reforming device B2 for performing surface reforming treatment to the surface of the soft solder alloy bumps that have been roughened by the surface roughening device A2.

Separately from the chamber 95 that is used for the aforementioned surface roughening treatment and surface reforming treatment, a nitrogen atmosphere reflow furnace C2 is provided. The nitrogen atmosphere reflow furnace C2 serves as a thermal melting unit for heating and melting the soft solder alloy bumps that have undergone surface reforming treatment and soldering the workpiece onto another conductor. In an alternative structure, a vapor phase soldering machine may be used as the thermal melting unit.

Next, the method of conducting presoldering treatment and an actual soldering by using an apparatus having the structure described above is explained hereunder.

The surface of the solder bumps 91 formed on the resin substrate 92 are mechanically roughened by the bump form adjusting roller 96 of the surface roughening device A2. Then, surface reforming treatment is performed to the roughened surface of solder bumps 91. This surface reforming treatment calls for forming a layer that contains fluorine on the surface of said solder bumps 91 by means of plasma excitation of a mixed gas containing at least one kind of fluorine compound and oxygen. Thus, the presoldering treatment is completed.

Thereafter, another workpiece, i.e. a silicone chip, is brought into contact with the solder bumps 91 of the resin substrate 92 that have undergone the surface roughening treatment and the surface reforming treatment, and, in this state, the workpiece and the bonding target are carried into the nitrogen atmosphere reflow furnace C1, where they are soldered together by reflow. The silicone chip may undergo surface roughening treatment and surface reforming treatment prior to the reflow process, but such treatments are not essential; whether the silicone chip should receive such treatments is decided according to the necessity.

Next, the function of the apparatus shown in FIG. 6 is explained in further detail.

The resin substrate 92 is placed on the metal tray 93, which also serves as a counter electrode, with the solder bumps 91 facing up. In this state, the resin substrate 92 is moved in the chamber 95 by means of the series of rollers 94 that are closely arranged side by side. A driving motor of the rollers 94 and chains that link the rollers together are not shown in FIG. 6.

The bump form adjusting roller 96 roughens the surface of the solder bumps on the resin substrate 92, which is being carried by the rollers 94. The degree of roughening depends on roughness of the surface of the bump form adjusting roller 96 and the clearance between the metal tray 93 and the bump form adjusting roller 96. This clearance can freely be adjusted by the adjusting jig 97.

When the metal tray 93 loaded with the resin substrate 92 has been moved via the bump form adjusting roller 96 to a location below the shower electrode 98, the rollers 94 are halted. The completion of the transfer of the metal tray 93 is automatically detected by the sensor 99 installed in the chamber 95. Meanwhile, the pressure in the chamber 95 is reduced by the vacuum pump 101, which operates through the throttle valve 100.

The pressure in the chamber 95 is monitored by the diaphragm gauge 105 and is adjusted by the throttle valve 100 so that the pressure becomes a preset level after the introduction of the gas.

When the metal tray 93 loaded with the resin substrate 92 reaches a point below the shower electrode 98 and comes to a standstill, oxygen and carbon tetrafluoride are fed through the mass flow controllers 103a,103b. The mixed gas, which has an oxygen concentration of 40 V/V %, is introduced into the chamber 95 through a plurality of holes bored in the shower electrode 98.

After the internal pressure in the chamber becomes stable at 30 Pa as a result of introduction of the gas, a 600 W high frequency power is fed from the 13.56 MHz high frequency power supply 107 through the matching box 106 to the shower electrode 98 so as to generate a high frequency glow discharge, thereby performing surface reforming treatment. Duration of the treatment is 60 seconds.

In case the workpiece has not received surface roughening treatment, 120 seconds is required to complete the surface reforming treatment. Furthermore, a test conducted without surface roughening treatment resulted in ashing of the solder resist on the surface of the resin substrate 93.

Following the high frequency glow discharge, the pressure return valve 108' is opened to introduce the nitrogen gas into the chamber 95 and bring the pressure in the chamber back to the atmospheric pressure. After the pressure is properly returned, the resin substrate is removed from the chamber. In FIG. 6, there is no obvious indication of a door of the chamber 95.

Meanwhile, the silicone chip that is intended to be soldered to the resin substrate should undergo surface reforming treatment beforehand according to the method of the fourth embodiment.

Next, in the atmospheric environment, the silicon chip is aligned with and placed on the resin substrate 92. At that time, pressure is applied so that the solder bumps become flattened by approximately 5 μm. Finally, the workpiece and the bonding target are heated in the nitrogen atmosphere reflow furnace C2 with an oxygen concentration of 100 ppm so that they are soldered together. The heating temperature is 230° C.

Both the fourth and fifth embodiments permit the use of an ultraviolet lamp or laser in the surface reforming device B1, B2 instead of the shower electrode 77b,98. In such a case, a power supply suitable for an ultraviolet lamp or laser is used instead of the high frequency power supply 79b or 107.

Next, the sixth embodiment of the present invention, which concerns soldering solder bumps formed on a silicone chip to Sn—Pb eutectic solder bumps formed on a resin substrate, is explained hereunder, referring to an exemplary apparatus shown in FIG. 4. In case of the present embodiment, the resin substrate has to undergo surface roughening treatment and surface reforming treatment. However, neither treatment is necessary for the silicone chip.

The resin substrate 71 as the workpiece is placed on the supporting jig 74 on the metal tray 73, with the solder bumps on the resin substrate 71 facing towards the shower electrode 77a. The surface roughening treatment of the solder bumps is performed in the chamber 72a by means of plasma treatment under a processing pressure of 40 Pa, with a 600 W output power from the high frequency power supply 79a by using a processing gas comprised of hydrogen gas containing 7 V/V % of argon. Duration of the plasma treatment is 120 seconds.

In an alternative method, the supporting jig 74 is not used; the metal tray 73 is connected to the high frequency power supply 79a so that the surface roughening treatment is done in a reactive ion etching mode.

After the plasma treatment, the partition shutter 84 is opened, and resin substrate 71 is transferred into the chamber 72b by the carrier robot arm 85. After the metal tray 73 loaded with the resin substrate 71 is placed on the retaining table 86, the carrier robot arm 85 is returned, and the partition shutter 84 is closed.

Then, the process gas, which is a mixed gas consisting of oxygen gas and carbon tetrafluoride gas is fed into the chamber 72 as its mixing ratio is adjusted to 60:40 by the mass flow controllers 80b,80c. The plasma treatment in the chamber 72b is done under a processing pressure of approximately 40 Pa, with a 600 W output power from the high frequency power supply 79a and duration of 60 seconds.

The silicon chip having solder bumps formed thereon is aligned with and placed on the resin substrate 71 that has undergone the treatments described above. At that time, pressure is applied so that the solder bumps become flattened by approximately 5 μm. The chip is placed on the resin substrate 71 in the atmospheric environment.

Thereafter, the resin substrate loaded with the chip is heated in the nitrogen atmosphere reflow furnace C1 with the oxygen concentration controlled to approximately 100 ppm so that the silicon chip is bonded to the solder bumps on the resin substrate by means of the melted solder. As no flux is used in the above process, there is no need of postprocess washing. The assembly process is completed by filling the gap between the chip and the resin substrate with an underfiller and then applying heat hardening treatment.

Figure 7A:
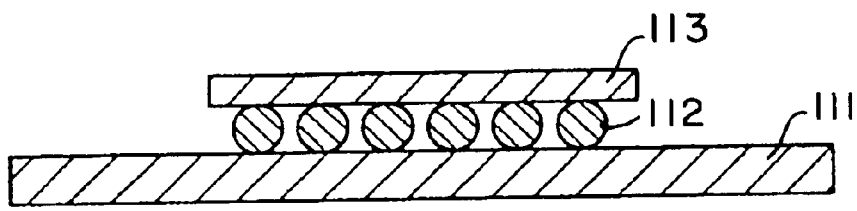
FIGS. 7(A)–7(C) are sectional views illustrating various forms of soldering by using solder bumps.
Figure 7B:
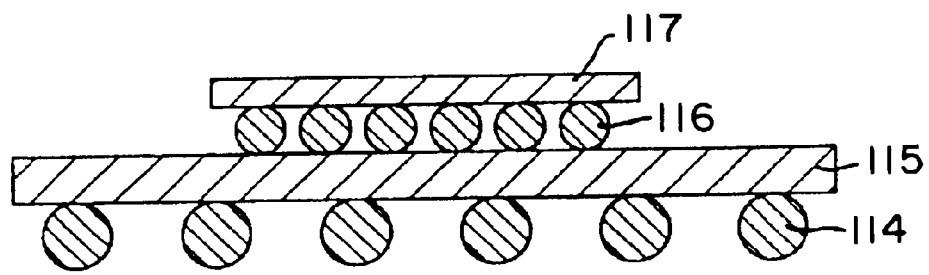
Figure 7C:
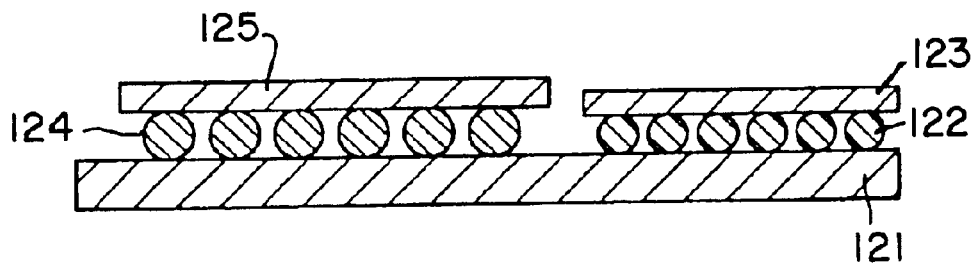

As it has been explained referring to the fifth and sixth embodiments, examples of methods of soldering a plurality of objects to one another include a method for mounting a bare chip directly on a printed circuit board as shown in FIG. 7(A), wherein a semiconductor bare chip 113 is soldered through connector bumps 112 to a multilayer printed circuit board 111; a method concerning an example of a structure of a flip chip joined semiconductor package as shown in FIG. 7(B), wherein a semiconductor bare chip 117 is soldered through internal connection bumps 116 to a laminated board (interposer) 115 on which solder bumps 114 for connecting a printed circuit board are formed; and a method concerning an example of a structure of a chip-on-chip (COC) as shown in FIG. 7(C), wherein a small LSI chip 123 is soldered through connector bumps 122 to a large scale integrated circuit (LSI chip) 121, while a memory chip 125 is soldered through connector bumps 124 to said LSI chip 121. Although it is not shown in the drawing, there also is a method that concerns a wafer-on-wafer (WOW), wherein a wafer or wafers are soldered through bumps to a wafer that has not been divided. The present invention is applicable to any one of these examples.

As described above, the invention calls for accumulating a soft solder alloy on such an electronic element as a chip or a printed circuit board and then giving it reflow treatment, thereby forming a solder precoating or solder bumps without using flux. As there is neither the need of a process of washing flux residue nor the problem of remaining flux residue, the invention provides an electrically reliable method and apparatus.

Examples of solder precoating methods or methods of forming solder bumps that are capable of cooping with minute patterns include a method that calls for printing a desired pattern on the surface of the workpiece according to the screen printing method, by applying solder paste onto the surface of the workpiece with a metal mask disposed between the workpiece and the paste, and performing reflow of the printed workpiece in order to form a precoating film; the Super Soldering method that calls for printing a pattern on the surface of the workpiece with a paste consisting of a mixture containing an organic acid lead salt, tin powder and an activator, and conducting reflow treatment in order to generate solder from reaction between the organic acid lead salt and the tin powder in the paste, thereby precipitating a solder precoating film on the pattern; and the Super Juffit (a name registered by Showa Denko K.K.) method that calls for forming an adhesive film on the workpiece, applying solder powder to the adhesive film, applying a flux to the film and then conducting a reflow process so as to form a solder precoating film on the workpiece. Any one of or a combination of methods and apparatuses according to the invention, such as the presoldering treatment method, the soldering method and apparatuses to be used for these methods, are applicable to the methods described above.

As explained referring to FIGS. 7(A)–7(C), there are various ways to bring solder bumps or a solder precoating formed on the surface of a workpiece into contact with similar solder bumps or a solder precoating formed on the surface of another object and give reflow treatment to these solder bumps or solder precoatings to solder them together. Each one of the methods or apparatuses according to the present invention is applicable to any one of those various ways and capable of electrically reliable and pinpoint soldering without using flux.

Although it is more cost effective to accumulate soft solder alloy on an electrode pad, a vapor deposition or other vacuum methods are also applicable. The soft solder alloy thus accumulated on the electrode is mechanically flattened or otherwise treated so as to roughen the surface of the soft solder alloy.

For example, the surface of the soft solder alloy can mechanically be roughened by pushing the soft solder alloy with rollers that have slightly bumpy surface in a chamber or during transportation of the workpiece on which the soft solder alloy is accumulated. Mechanical roughening is also possible by stamping the solder alloy with a plate that has a slightly bumpy surface, Surface roughening treatment may also be performed by exposing the surface of the soft solder alloy to a glow discharge using argon gas to which hydrogen has been added with a mixing ratio of the hydrogen to the total volume of the mixed gas ranging from 3 to 8 V/V %. It is not possible to perform surface roughening treatment by spattering using argon.

As a result of the surface roughening treatment, the oxide film is removed or broken, exposing a new surface of the solder.

Thereafter, the surface of the soft solder alloy is improved by means of plasma excitation using a mixed gas that consists of a fluorine compound gas and either one of or both oxygen and argon. Said fluorine compound gas contains at least one kind of fluorine compound selected from among sulfur hexafluoride ($SF_6$), nitrogen trifluoride ($NF_3$) and carbon fluoride compounds, such as carbon tetrafluoride ($CF_4$), $CHF_3$, $CH_3F$ and $C_2F_6$, provided that fluorine compound gases that may form a plasma polymer film, such as $C_2F_4$ or $C_3F_6$, cannot be used.

The plasma excitation mentioned above may be done by using the parallel flat plate type DC glow discharge or high frequency glow discharge. It is also possible to generate plasma by using microwaves or use a radical generating means that uses ultraviolet, laser or the like.

Fluorine is a silicone etchant, and oxygen decomposes organic substances. However, as the surface roughening treatment is done beforehand, the present invention is capable of treatment that causes little damage to the silicone or solder resist.

Following the surface reforming treatment described above, reflow of the soft solder alloy is conducted by heating the soft solder alloy in a non-oxidizing atmosphere at a temperature higher than the melting point of the soft solder alloy. A widely used nitrogen atmospheric reflow furnace, a vapor phase soldering machine or the like may be used for the reflow treatment.

When mounting a silicone chip having soft solder alloy bumps or an electronic element that is provided with soft solder and/or an electrode plated with palladium (Pd), silver (Ag), gold (Au) or the like on soft solder alloy on a circuit board, a gold pad on a silicone chip, or solder bumps, solder bonding can be conducted by a process that comprises steps of applying surface roughening treatment and surface reforming treatment to the surface of each soft solder alloy or the equivalent portion of each object; aligning the two objects and placing one on top of the other; and giving them reflow treatment by heating them in a non-oxidizing atmosphere at a temperature higher than the melting point of any soft solder alloy intended for bonding.

In case of mounting an electronic on a circuit board, soldering is possible without the surface roughening treatment or the surface reforming treatment to the electronic element, provided that a quantity of the soft solder alloy on the circuit board. In case of soldering soft solder alloy bumps to other soft solder alloy bumps, it is sufficient to apply such a pressure as to flatten bumps by about 5 $\mu$m when aligning the objects.

As explained above, the above bump forming method calls for irradiating a soft solder alloy accumulated on a workpiece with plasma containing hydrogen, thereby removing hydroxides and oxides from the soft solder alloy. The method is thus capable of forming bumps that will serve as mechanical and electrical connecting terminals on an electronic element without the need of flux for the reflow process or postprocess washing.

By bringing the soft solder alloy on the surface of a workpiece, which has been irradiated with hydrogen-containing plasma, into contact with the surface of the object targeted for soldering and giving the two objects reflow treatment in this state, the soldering method described above enables the simultaneous execution of formation of bumps and soldering without the need of flux, use of which would necessitate postprocess washing.

By using a plasma generating means adapted to generate at least plasma that contains hydrogen, a gas supply means for feeding process gas, and a workpiece exposing means adapted to expose a workpiece to at least the plasma that contains hydrogen, a bump forming apparatus described above irradiates a soft solder alloy of a workpiece with plasma containing hydrogen, thereby removing hydroxides and oxides from the soft solder alloy, and performs a reflow process by heating the soft solder alloy in a vacuum by using a heating means, thereby preventing re-oxidation of the soft solder alloy during the reflow process. Therefore, the apparatus does not necessitate a flux during reflow of the soft solder alloy and is therefore capable of eliminating the flux washing process after formation of solder bumps. As a result, the apparatus prevent environmental problems that would otherwise be caused by washing the flux.

The soldering apparatus described above is adapted to position a workpiece that has been treated with plasma by said bump forming apparatus and the object targeted for soldering by a positioning means such that the two objects are aligned and that their surfaces are in contact with each other, and conduct a reflow process of the film of the soft solder alloy with a heating means. Thus, the soldering apparatus is capable of simultaneously forming bumps on the surface of the workpiece and soldering said bumps on the object targeted for soldering without using flux, use of which would necessitate postprocess washing.

According to any one of the bump forming methods, the presoldering treatment method and the soldering method explained above, roughening the surface of the soft solder alloy accumulated on the workpiece or the surface of the solder bumps formed on the workpiece reduces the duration of the surface reforming treatment performed thereafter and also protects the workpiece, such as a chip or a circuit board, from damage. Furthermore, as a fluorine containing layer formed as a result of surface reforming treatment improves the solder wettability and prevents re-oxidation of the surface of the solder, there is no need of flux to conduct the reflow process even if a soft solder alloy is used. Therefore, each and every method of the invention described above enables the elimination of a postprocess washing process.

According to any one of the bump forming apparatus, the presoldering treatment apparatus and the soldering apparatus explained above, roughening the surface of the soft solder alloy accumulated on the workpiece or the surface of the solder bumps formed on the workpiece by means of a surface roughening device reduces the duration of the surface reforming treatment performed thereafter and also protects the workpiece, such as a chip or a circuit board, from damage. Furthermore, as a fluorine containing layer formed as a result of surface reforming treatment by a surface reforming device improves the solder wettability and prevents re-oxidation of the surface of the solder, there is no need of flux to conduct the reflow process by a thermal melting unit, even if a soft solder alloy is used. Therefore, each and every apparatus of the invention described above enables the elimination of a postprocess washing process.

FIGS. 8–10 illustrate a number of preferred embodiments of the invention. Solder bumps 91 of a soft solder alloy are formed on a metallized layer 92a of a solder bump plate, which may be a silicon wafer or a printed board. Such a silicon wafer or a printed board is hereinafter referred to as a substrate 92. The surface of the solder bumps 91 is mechanically roughened by any one of the methods described hereunder.

Figure 8A:
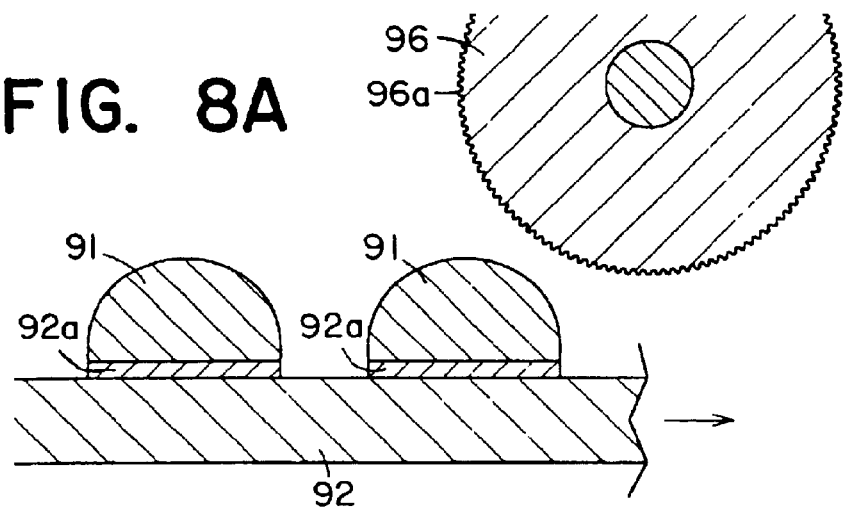
FIGS. 8(A)–8(C) are sectional views illustrating a rolling type roughing method of the present invention.
Figure 8B:
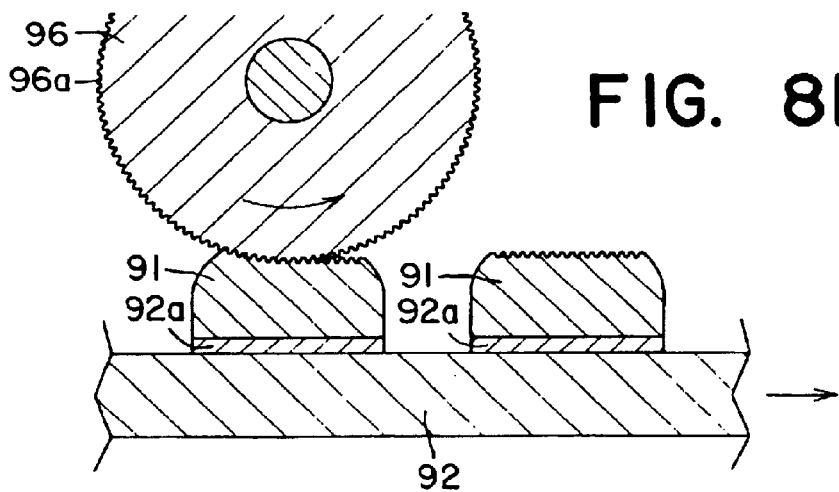

FIG. 8(A) illustrates a rolling type roughening method. When the substrate 92 is horizontally moved against the aforementioned bump form adjusting roller 96, which is a roller serving as the roughening member and has on the outer surface thereof a bumpy surface 96a having minute indentations and protrusions, the bump form adjusting roller 96 rolls on the plural number of solder bumps 91 on the substrate 92 as shown in FIG. 8(B), simultaneously flattening and roughening the surface of the solder bumps 91. At this time, the same result can be achieved by horizontally moving the bump form adjusting roller 96 against the substrate 92 instead of moving the substrate 92 against the bump form adjusting roller 96.

Figure 8C:
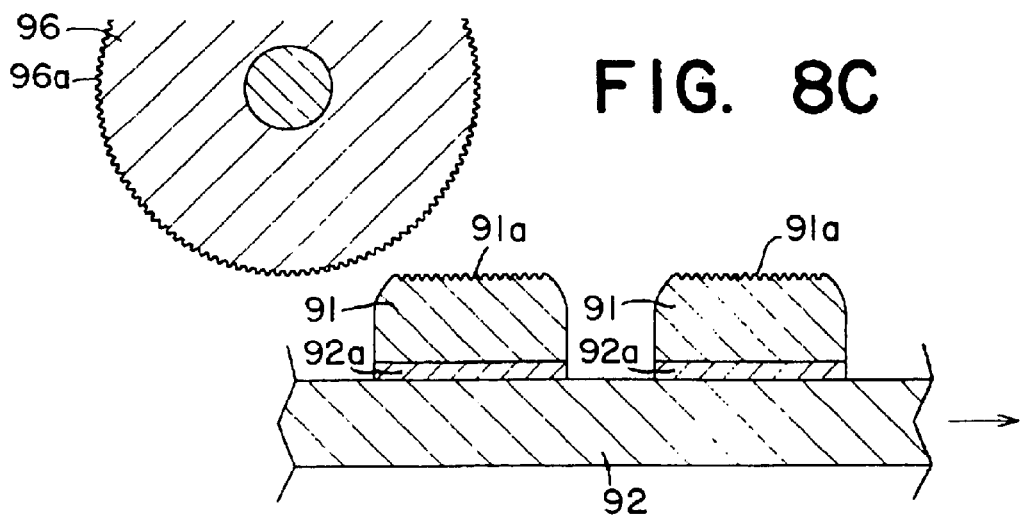

As shown in FIG. 8(C), a new surface 91a having minute indentations and protrusions is formed as the substrate 92 detaches from the bump form adjusting roller 96. Thus, a new solder surface 91a that is free from partial oxidation is formed by mechanical roughening.

The bump form adjusting roller 96 may be made of, for example, a metal roller with a slightly roughened surface or such materials as porous ceramics formed into the shape of a roller.

Even if the overall surface roughness of the bump form adjusting roller 96 is relatively coarse, the surface of the solder bumps 91 can be made sufficiently fine by repeating rolling actions described above for surface roughening.

Furthermore, the use of the bump form adjusting roller 96 enables the efficient continuous surface roughening treatment to numerous silicon wafers or printed boards successively carried by a conveyor.

Figure 9A:
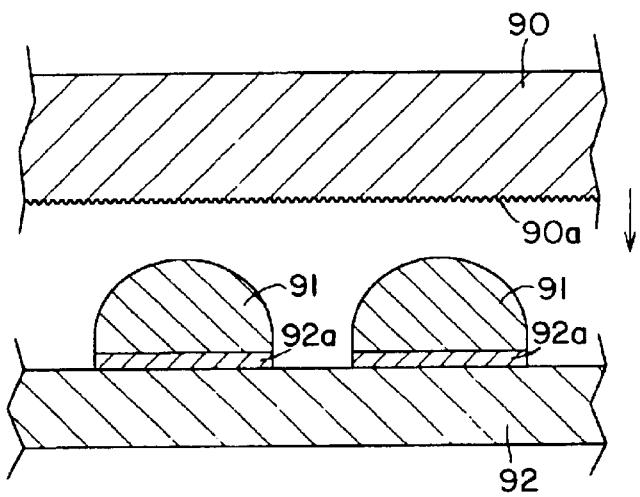
FIGS. 9(A)–9(C) are sectional views illustrating a stamping-type roughing method of the present invention.
Figure 9B:
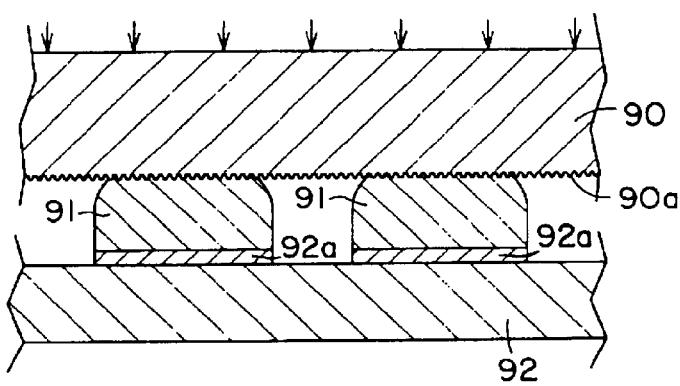
Figure 9C:
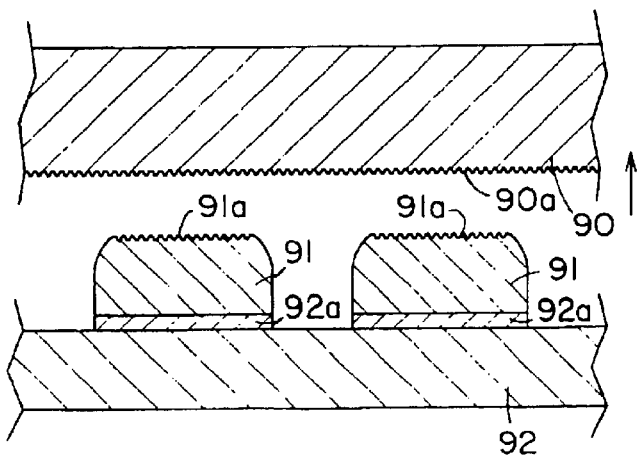

A stamping-type roughening method is illustrated in FIGS. 9(A)–9(C). A flat plate 90 serving as the roughening member is positioned so that a bumpy surface 90a, which is formed on the underside of the flat plate 90 and has minute indentations and protrusions, faces a plurality of solder bumps 91 on a substrate 92. By placing the flat plate 90 in this state on the surface of solder bumps 91 and applying a given load to the flat plate 90 as shown in FIG. 9(B), the surface of the solder bumps 91 is simultaneously flattened and roughened by the flat plate 90.

As shown in FIG. 9(C), a new surface 91a having minute indentations and protrusions is formed on the surface of the solder bumps 91 as the flat plate 90 is elevated. Thus, a new solder surface 91a that is free from partial oxidation is formed by mechanical roughening.

Even if the overall surface roughness of the flat plate 90 is relatively coarse, the surface of the solder bumps 91 can be made sufficiently fine by repeating stamping actions to the surface of the same solder bumps 91 while horizontally moving the position of the flat plate 90 relative to the solder bumps 91.

Figure 10A:
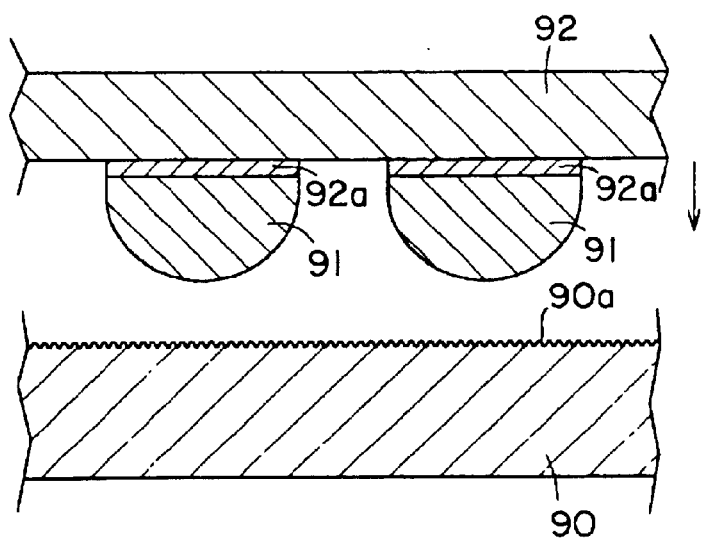
FIGS. 10(A)–10(C) are sectional views illustrating another stamping-type roughing method embodiment of the present invention.
Figure 10B:
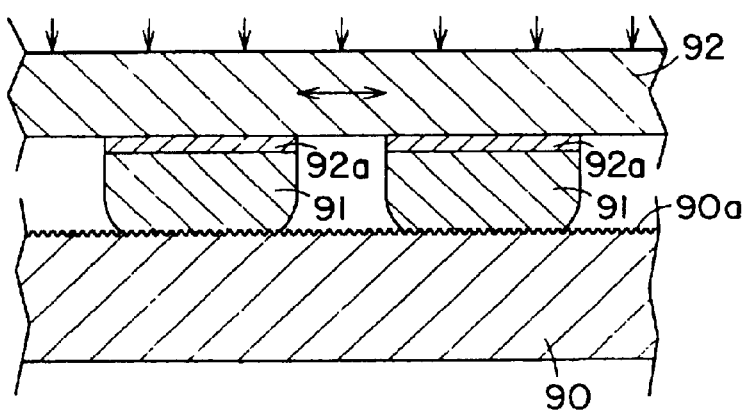
Figure 10C:
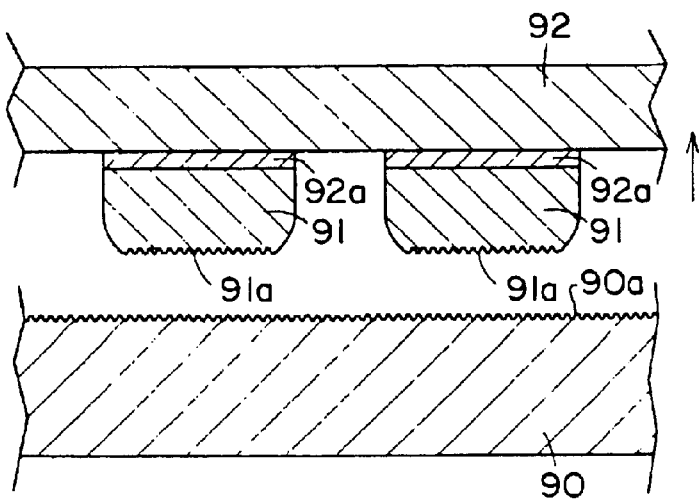

FIGS. 10(A)–10(C) illustrate another embodiment of stamping-type roughening method. A substrate 92 is positioned above a flat plate 90 serving as the roughening member so that the surface of a plurality of solder bumps 91 formed on the substrate 92 faces a bumpy surface 90a which is formed on the underside of the flat plate 90 and has minute indentations and protrusions. By placing the substrate 92 in this state on the bumpy surface 90a of the flat plate 90 and applying a given load to the substrate 92 as shown in FIG. 10(B), the surface of the solder bumps 91 is simultaneously flattened and roughened by the flat plate 90.

Even if it is not possible to apply a sufficient load to the substrate 92, the surface of the solder bumps 91 can be roughened by horizontally scratching, rubbing, or scrubbing the substrate 92.

As illustrated in FIG. 10(C), a new surface 91*a* having minute indentations and protrusions is on the surface of the solder bumps 91 as the substrate 92 is elevated. Thus, a new solder surface 91*a* that is free from partial oxidation is formed by mechanical roughening.

Even if the overall surface roughness of the flat plate 90 is relatively coarse, the surface of the solder bumps 91 can be made sufficiently fine by repeating stamping actions to the surface of the same solder bumps 91 while horizontally moving the position of the substrate 92 relative to the flat plate 90.

Results of tests performed to roughen the surface of solder bumps 91 by using a metal roller as the bump form adjusting roller 96 of the rolling-type roughening method described above are explained hereunder, referring to FIGS. 11 and 12, which were both obtained by using a laser microscope.

Figure 11:
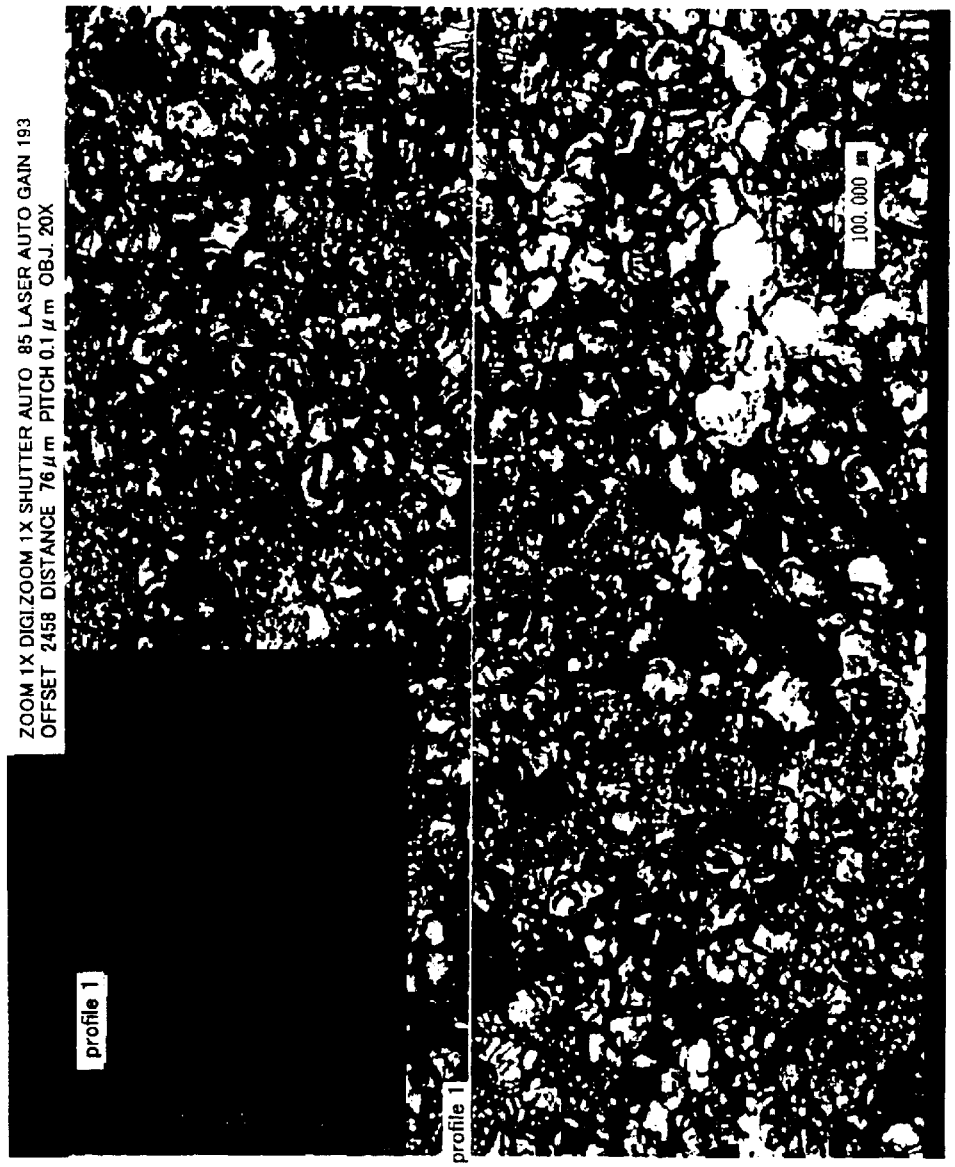
FIG. 11 is a laser microscopic image of the surface of the solder bumps as formed by a current embodiment.

FIG. 11 shows the appearance of the surface of the metal roller and results of measurements of the surface roughness of the metal roller. The average surface roughness Ra of the metal roller is 3.40 μm.

Figure 12:
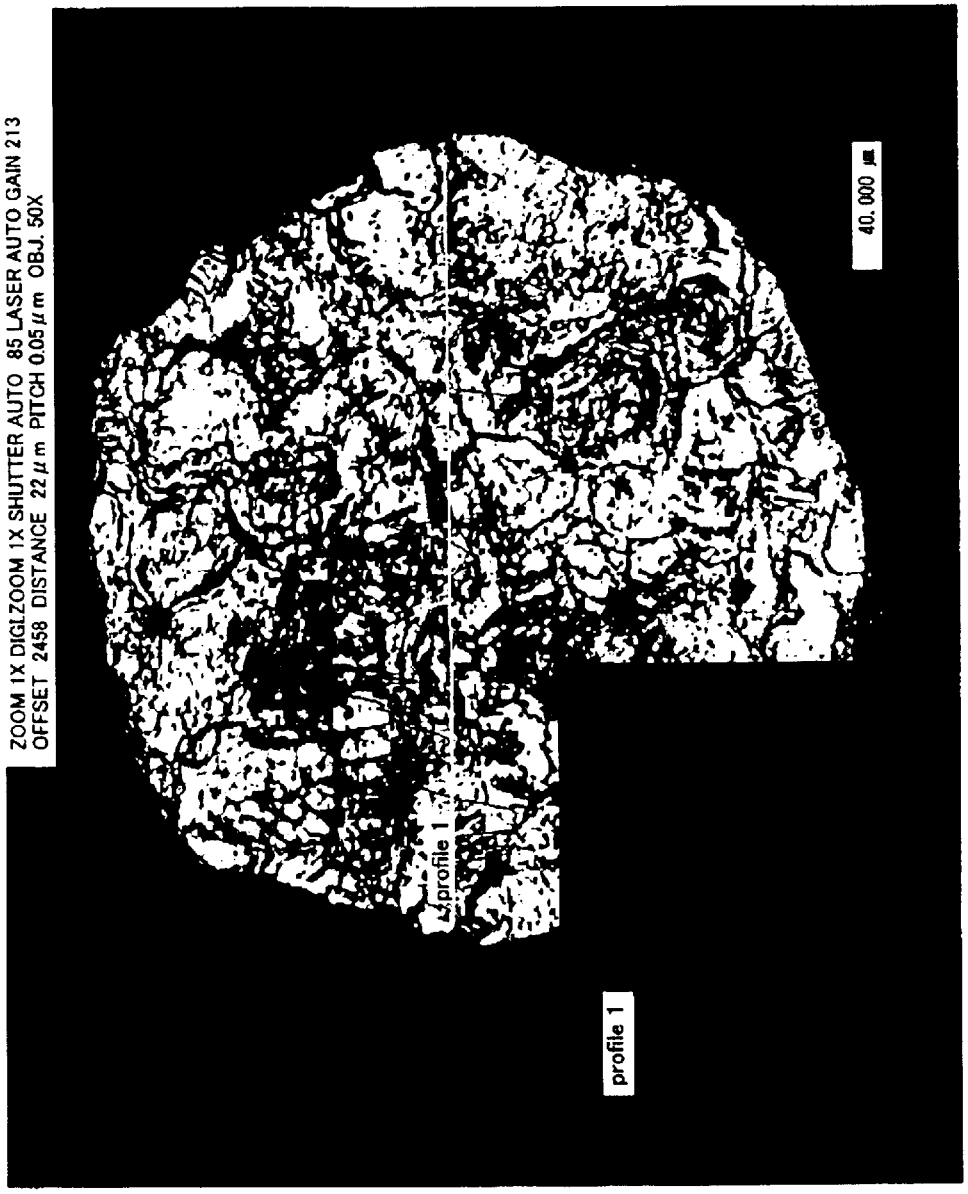
FIG. 12 is a laser microscopic image of the surface of the solder bumps as formed by a current embodiment.

FIG. 12 shows the appearance of the surface (the roughened surface 91*a*) of the solder bumps 91 that have undergone surface roughening treatment by rolling with the metal roller three times, and results of measurements of the surface roughness of the solder bumps 91. The average surface roughness Ra of the solder bumps 91 is 1.28 μm.

EXAMPLE 1

Results of a test conducted by using a bump forming apparatus shown in FIG. 1 are explained hereunder, referring to specific figures concerning the test.

The workpiece was a silicone wafer 11 having an aluminum electrode pad, which had been plated with eutectic solder as a soft solder alloy, with a metallized layer disposed between the aluminum electrode pad and the eutectic solder.

The pressure in the vacuum chamber 12 was adjusted to approximately 0.44 Torr by means of the throttle valve 17 or control of gas flow rate performed by the mass flow controller 34.

A 13.56 MHz RF (radio frequency) power supply, which is easily obtained, was used as the high frequency power supply 23 to feed a 600 W power to the electrode 22 via the capacitive load matching unit 24, thereby generating plasma.

After the plasma irradiation for 60 seconds, the supply of the process gas was stopped, and an electric power of 100 W was applied from the dc power supply 39 to the halogen lamp 37 to heat the silicone wafer 11 by radiation. The light from the halogen lamp 37 was so adjusted by the reflecting mirror 38 to bear on the silicone wafer 11 uniformly.

After the solder plate was melted, the halogen lamp 37 was turned off, and the workpiece was maintained in that condition for 30 seconds to cool down.

Each solder bump thus formed on the silicone wafer 11 had a neat, rounded shape with no oxides on its surface.

For sake of comparison, a test was conducted in the same manner as above except that pure argon gas was used as the process gas. Produced as a result of the test ware solder bumps which had a rounded but rough surface containing a lot of oxides.

In case the process gas consisted solely of gas containing a fluorine, e.g. carbon tetrafluoride, it presented problems such that of a passivation film of the silicone wafer 11 was etched and that silicon fluoride generated from reaction of the etched silicone became attached to the bumps.

EXAMPLE 2

Next, results of another test conducted by using a bump forming apparatus shown in FIG. 1 are explained hereunder.

A chip and a substrate serving as a bonding target to which the chip was to be bonded by soldering were exposed to plasma irradiation. Said chip was comprised of a silicone wafer 11 and bumps formed thereon by using the apparatus shown in FIG. 1.

First, the workpieces were treated for 60 seconds with argon gas plasma containing 7 V/V % of hydrogen under a pressure of approximately 0.4 Torr with a 600 W output power from the RF power supply.

Then, the workpieces were treated for 30 seconds with oxygen gas plasma containing 70 V/V % of carbon tetrafluoride under a pressure of approximately 0.3 Torr with a 500 W output power from the RF power supply.

The chip and the substrate were then removed from the vacuum chamber 12, and the chip was aligned with and placed on the substrate. In this state, they received a load just sufficient to slightly flatten the solder bumps and were moved into the reflow furnace, in which the concentration of oxygen was maintained at approximately 100 ppm.

Reflow bonding was conducted in the reflow furnace at a preheating temperature of 80° C., a reflow temperature of 230° C. and conveying speed of the substrate loaded with the chip of 1.3 m/min.

As a result of the test, barrel-shaped bonding points were obtained without using a flux.

Next, tests were conducted to solder a chip onto a substrate by using a soldering apparatus shown in FIG. 4, and results of the test are explained hereunder, referring to Examples 3 and 4.

EXAMPLE 3

First, surface roughening treatment was applied to the substrate with argon gas plasma containing 7 V/V % of hydrogen for a duration of 120 seconds under a pressure of approximately 0.4 Torr with a 600 W output power from the corresponding RF power supply.

Then, the substrate whose surface had been roughened by the hydrogen containing argon plasma underwent surface reforming treatment for 60 seconds with oxygen gas plasma containing 60 to 70 V/V % of carbon tetrafluoride under a pressure of approximately 0.4 Torr with a 500 W output power from the other RF power supply.

The chip underwent surface roughening treatment with argon gas plasma containing 7 V/V % of hydrogen for a duration of 60 seconds under a pressure of approximately 0.4 Torr with a 500 W output power from a RF power supply.

Thereafter, the chip whose surface had been roughened by the hydrogen containing argon plasma underwent surface reforming treatment for 30 seconds with oxygen gas plasma containing 40 to 60 V/V % of carbon tetrafluoride under a pressure of approximately 0.4 Torr with a 500 W output power from the RF power supply.

The chip was then mounted on the substrate that had been treated as above, and, in this state, they were carried into the nitrogen atmosphere reflow furnace C1, in which they underwent reflow treatment with the concentration of oxygen maintained at approximately 100 ppm. As a result, good bonding points were obtained without using a flux.

EXAMPLE 4

Surface roughening treatment was applied to the substrate with argon gas plasma containing 7 V/V % of hydrogen for a duration of 120 seconds under a pressure of approximately 0.4 Torr with a 600 W output power from the corresponding RF power supply.

Then, the substrate whose surface had been roughened by the hydrogen containing argon plasma underwent surface reforming treatment for 60 seconds with oxygen gas plasma containing 60 V/V % of carbon tetrafluoride under a pressure of approximately 0.4 Torr with a 500 W output power from the other RF power supply.

After mounting the untreated chip on the substrate that had been treated as above, they were carried into the nitrogen atmosphere reflow furnace C1, in which they underwent reflow treatment with the concentration of oxygen maintained at approximately 100 ppm. As a result, good bonding points were obtained without using a flux.

As described above, the present invention is applicable to forming solder precoatings or solder bumps on electronic elements or circuit boards as well as soldering of these components. The invention is also applicable to bonding an electrode or a component lead of a chip to an electrode of a circuit board by using a soft solder alloy.

EXAMPLE 5

An analysis by means of laser microscope of the effect of plasma treatment was performed and the various stages are illustrated in FIGS. 13–17.

Figure 13:
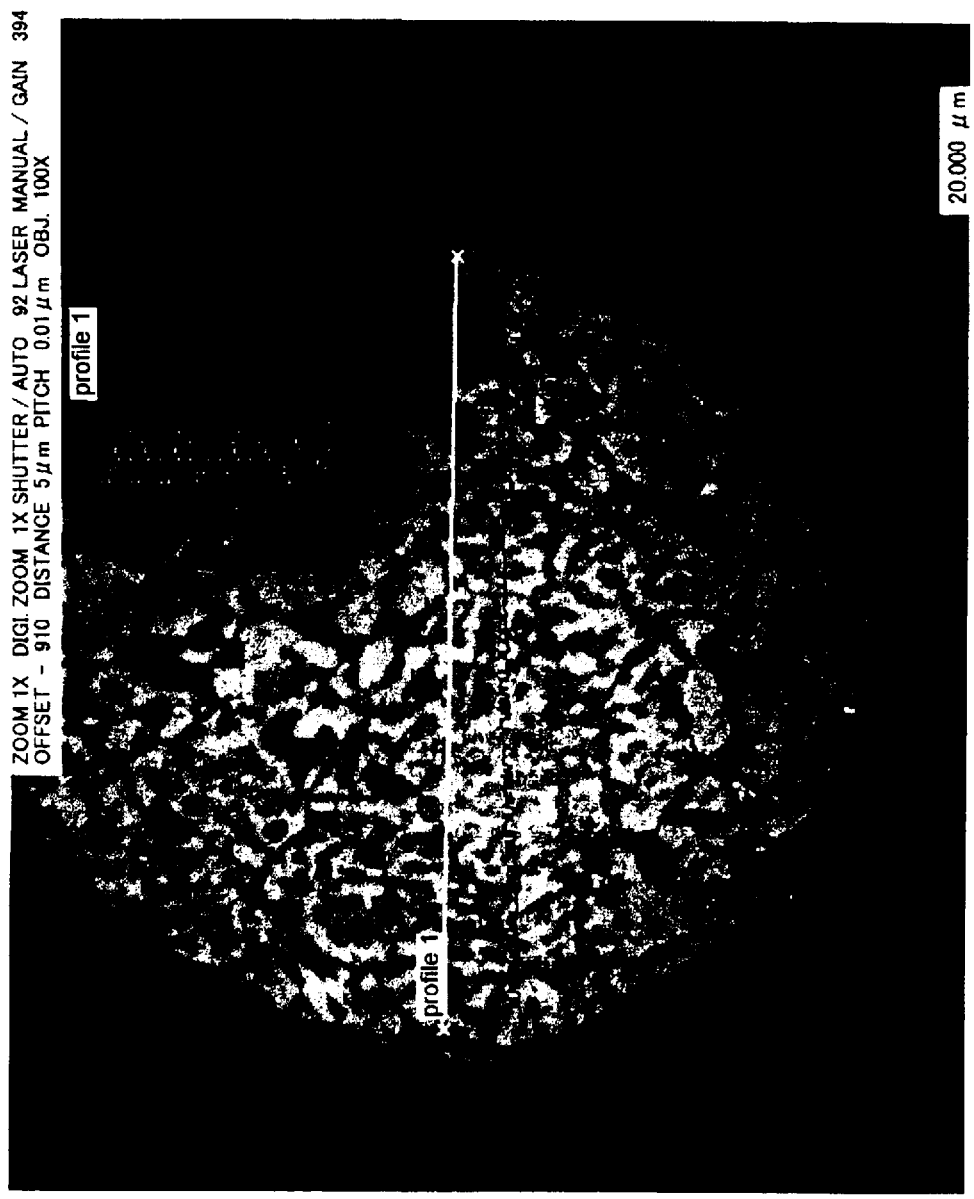
FIG. 13 is a laser microscopic image of the initial state of the solder bumps.
Figure 14:
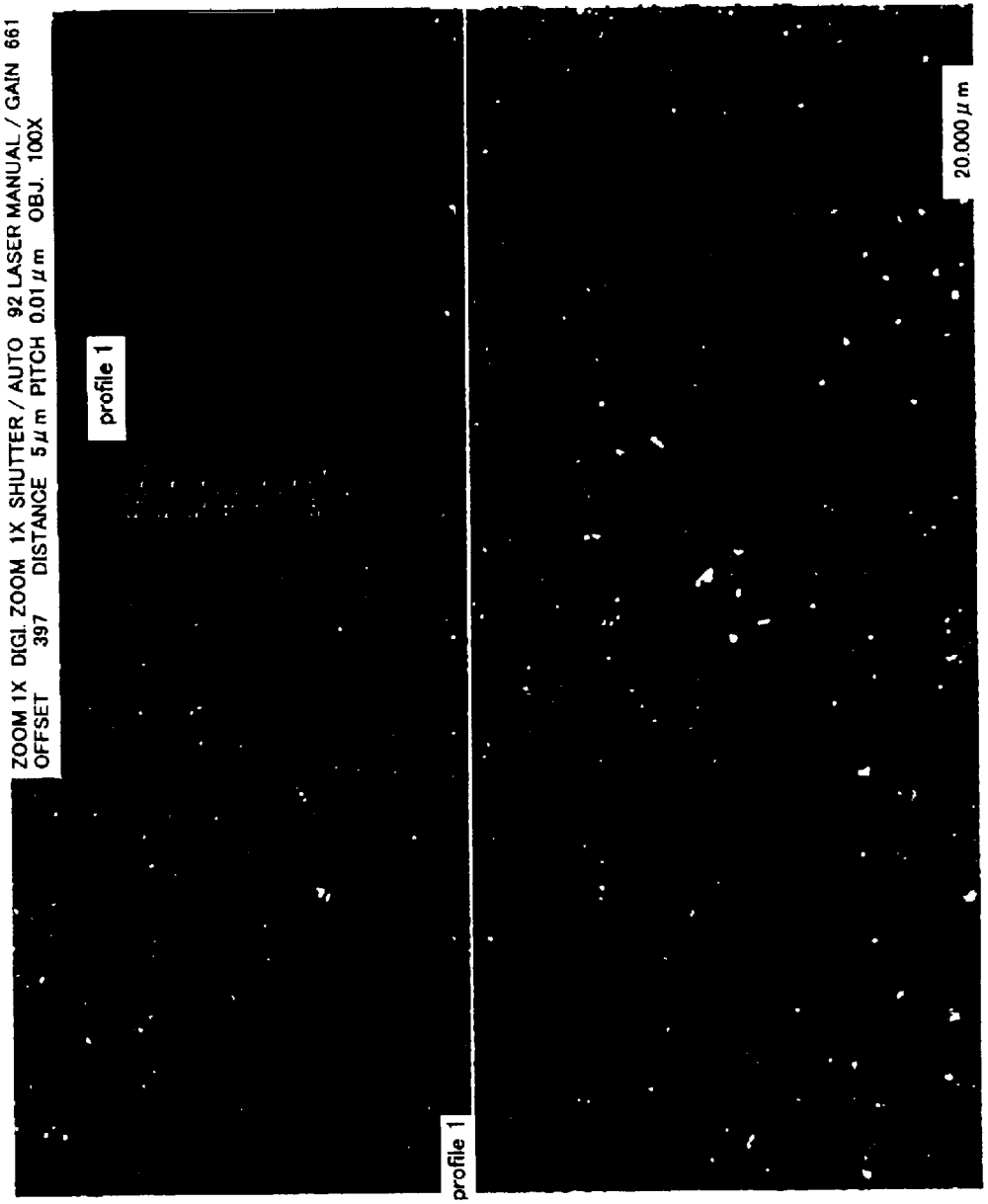
FIG. 14 is a laser microscopic image illustrating the initial state of the solder resist.
Figure 15:
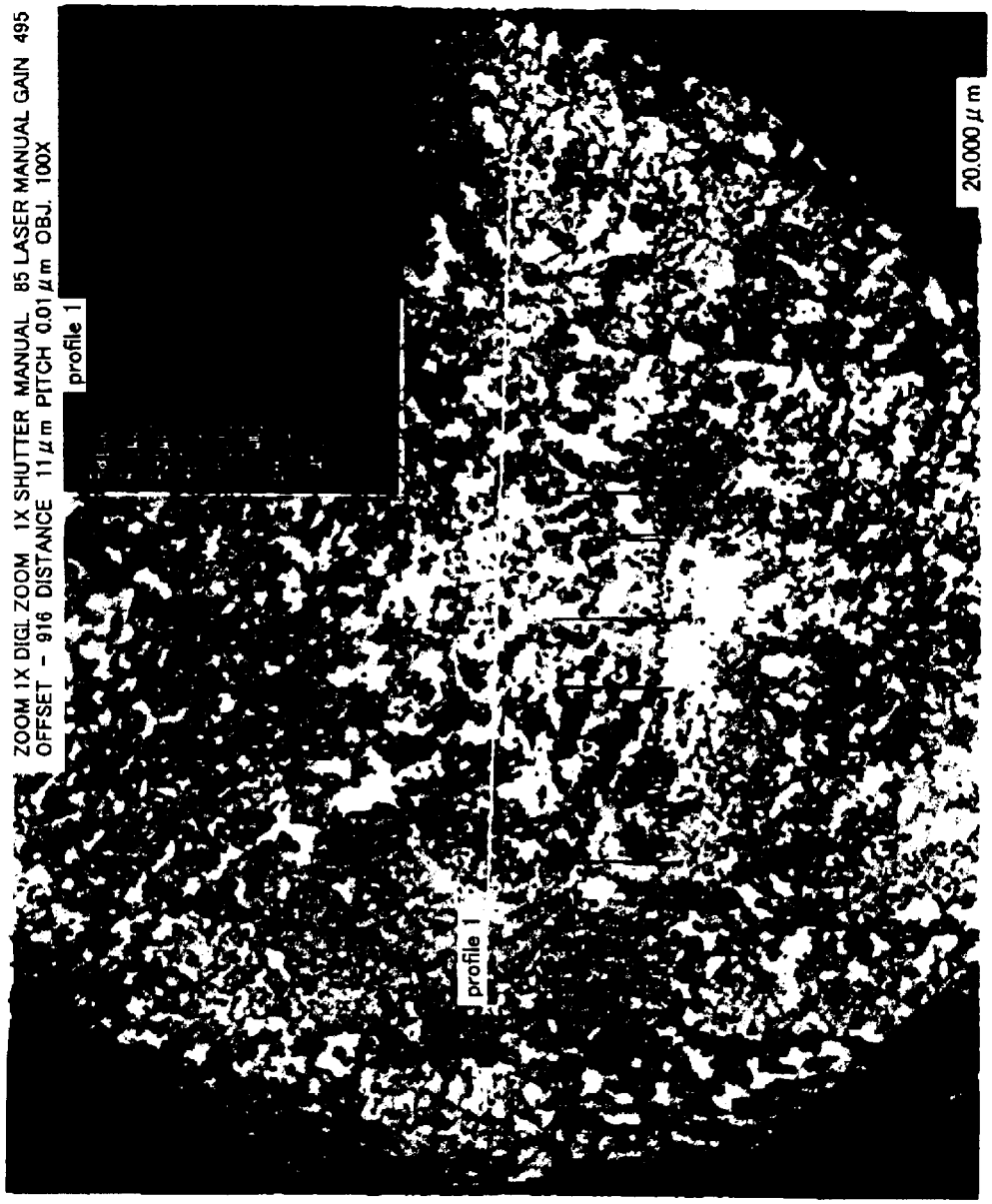
FIG. 15 is a laser microscopic image illustrating the changes in the surface of the solder bumps after a treatment by a prior art method.

FIG. 13 shows the initial state of solder bumps, and FIG. 14 shows the initial state of solder resist. FIG. 15 shows the changes in the surface of the solder bumps after any oxygen plasma treatment described in the specification of U.S. Pat. No. 4,921,157 to Dishon, et al. (herein after "Dishon") has been applied for 5 minutes and FIG. 16 shows changes in the surface of the solder resist after 5 minutes of an oxygen plasma treatment.

Figure 17:
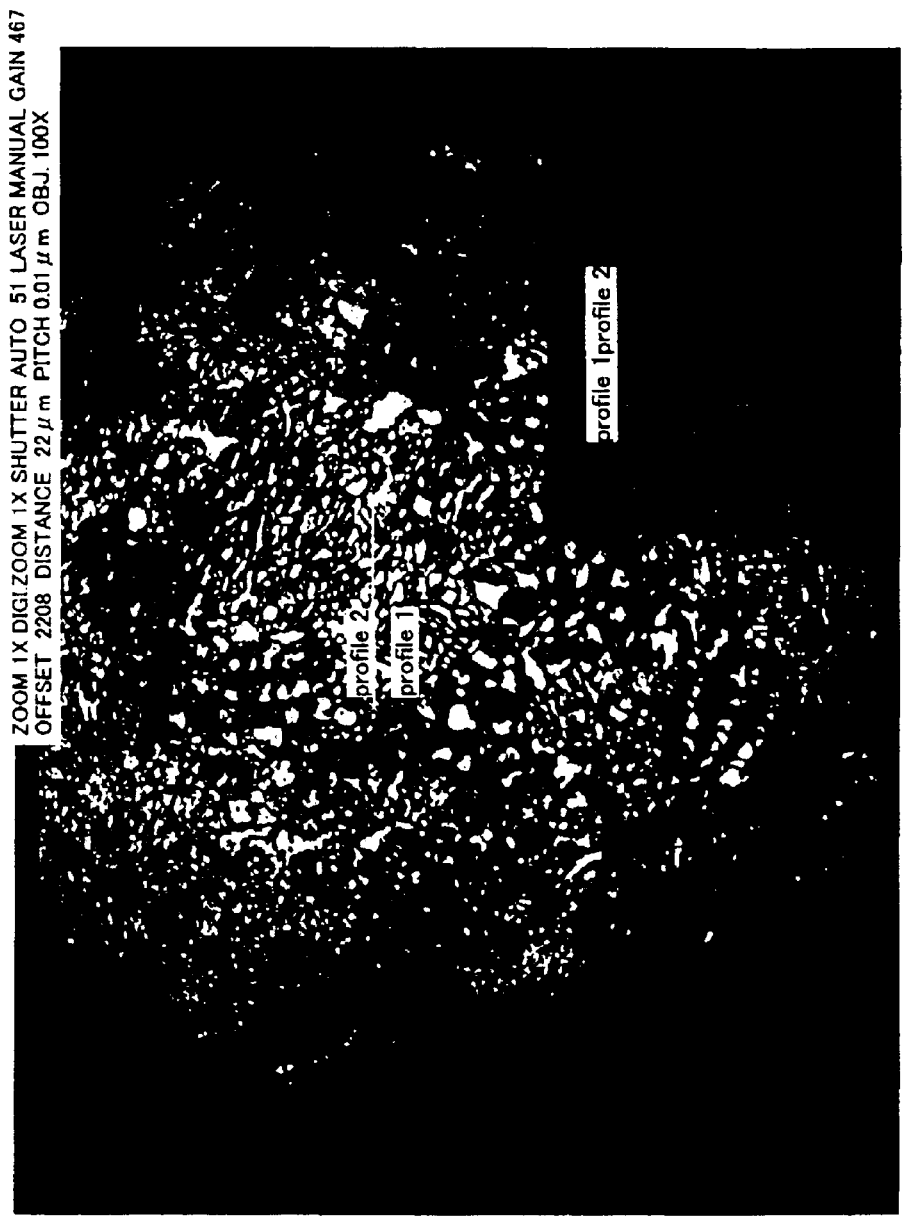
FIG. 17 is a a laser microscopic image illustrating the changes in the surface to the solder bumps using the preferred ? embodiment of the current invention.

FIG. 17 shows changes in the surface of the solder bumps after irradiation for 1 minute with argon-hydrogen plasma according to the invention under the present application.

While the average degree of roughening (Ra) of the surface of the solder bumps in the initial state shown in FIG. 13 is 0.04 $\mu$m, the average surface roughness (Ra) of the solder bumps after the oxygen plasma treatment shown in FIG. 15 is still 0.04 $\mu$m. The laser microscope was incapable of recognizing changes in the roughness of the surface of solder bumps that have been treated with oxygen plasma.

Figure 16:
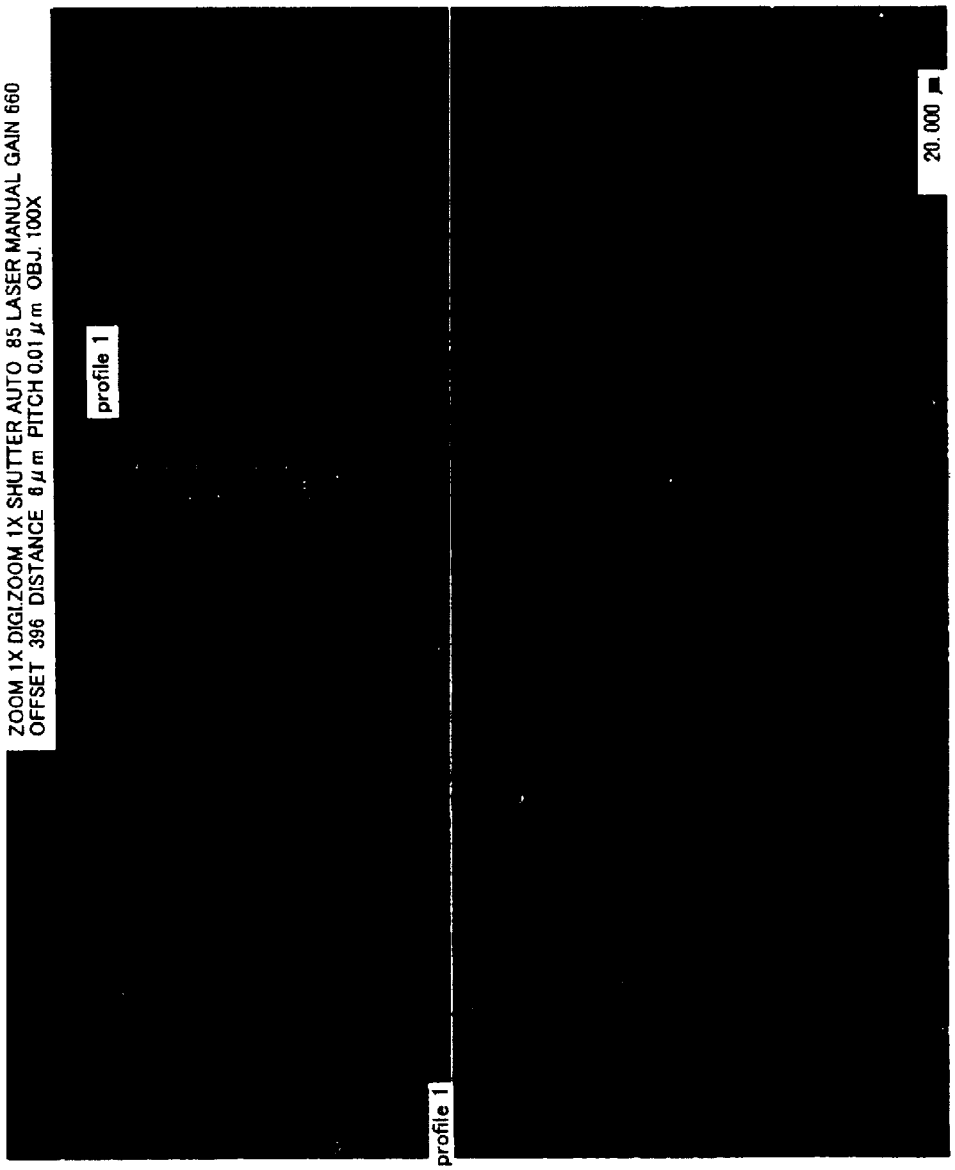
FIG. 16 is a laser microscopic image illustrating in the surface solder resist using an embodiment of the present invention.

Concerning the surface of solder resist, however, the average degree of roughening (Ra) of the surface of the solder resist in the initial state shown in FIG. 14 is 0.06 $\mu$m, while the average surface roughness (Ra) after the oxygen plasma treatment shown in FIG. 16 is 0.38 $\mu$m. Changes in the roughness of the surface of the solder resist that has been treated with oxygen plasma can be clearly recognized even by means of a laser microscope.

It is evident from the above that irradiation with oxygen plasma for a period of 5 minutes produces conspicuous changes in the roughness of the surface of solder resist but does not affect the surface of solder bumps. As it is not desirable to cause changes in the roughness of the surface of the solder resist, the duration of irradiation with oxygen plasma may be further reduced. This, however, increases the difficulty to change the roughness of the surface of solder bumps.

As shown in FIG. 17, an argon-hydrogen plasma treatment according to the invention under the present application causes the average surface roughness (Ra) of the surface of the solder bumps to increase from the initial 0.04 am to 0.24 or 0.25 $\mu$m, producing conspicuous changes in the roughness of the surface of the solder bumps in much shorter duration, i.e. one-fifth of the time required by an oxygen plasma treatment.

EXAMPLE 6

Figure 18:
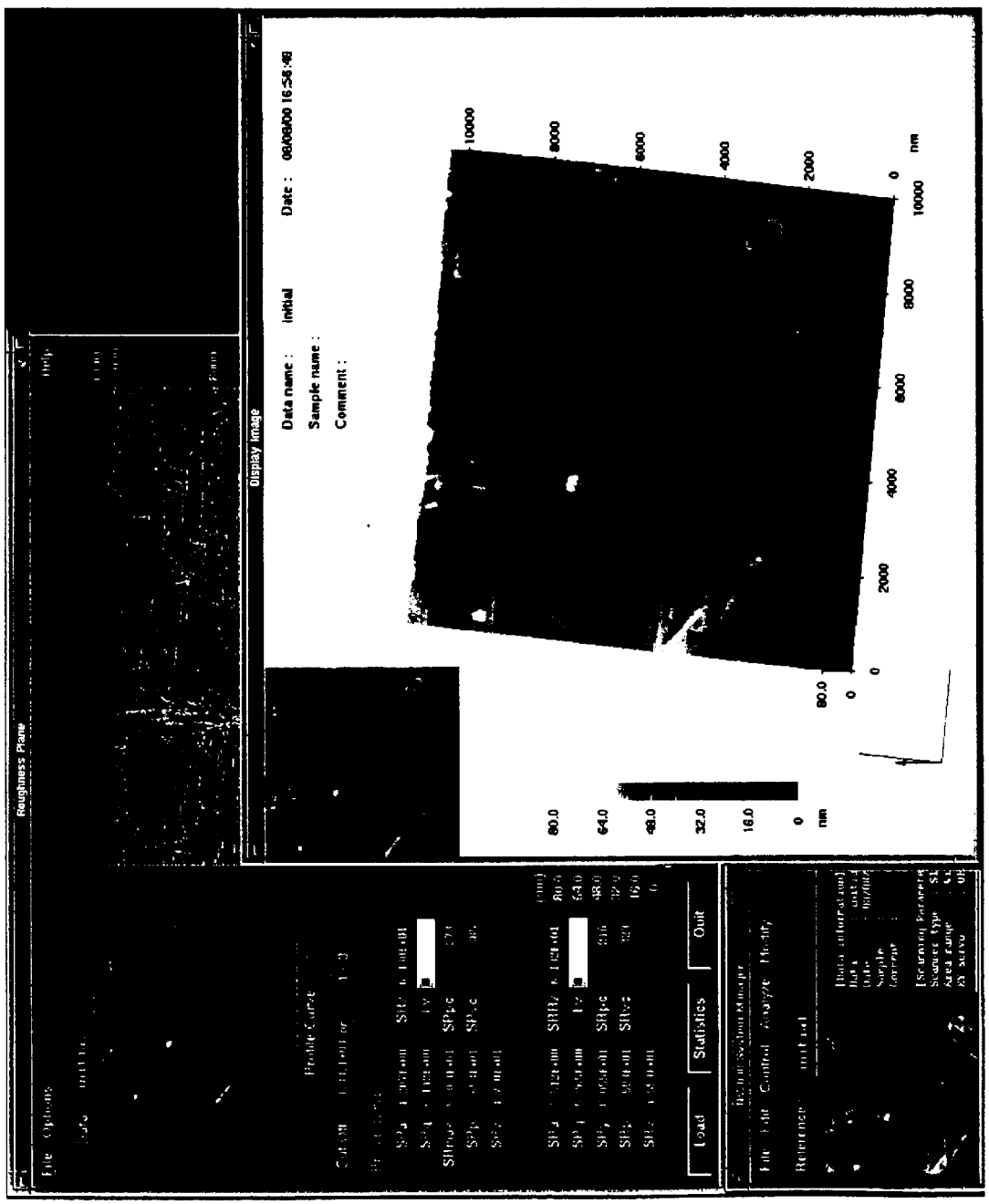
FIG. 18 is an atomic force microscopic image showing the initial state of the solder bumps.

An analysis was performed by means of atomic force microscope of the effect of plasma treatment. FIG. 18 shows the initial state of solder bumps, and FIG. 19 shows changes in the surface of the solder bumps after an oxygen plasma treatment described by Dishon has been applied for 5 minutes.

Figure 19:
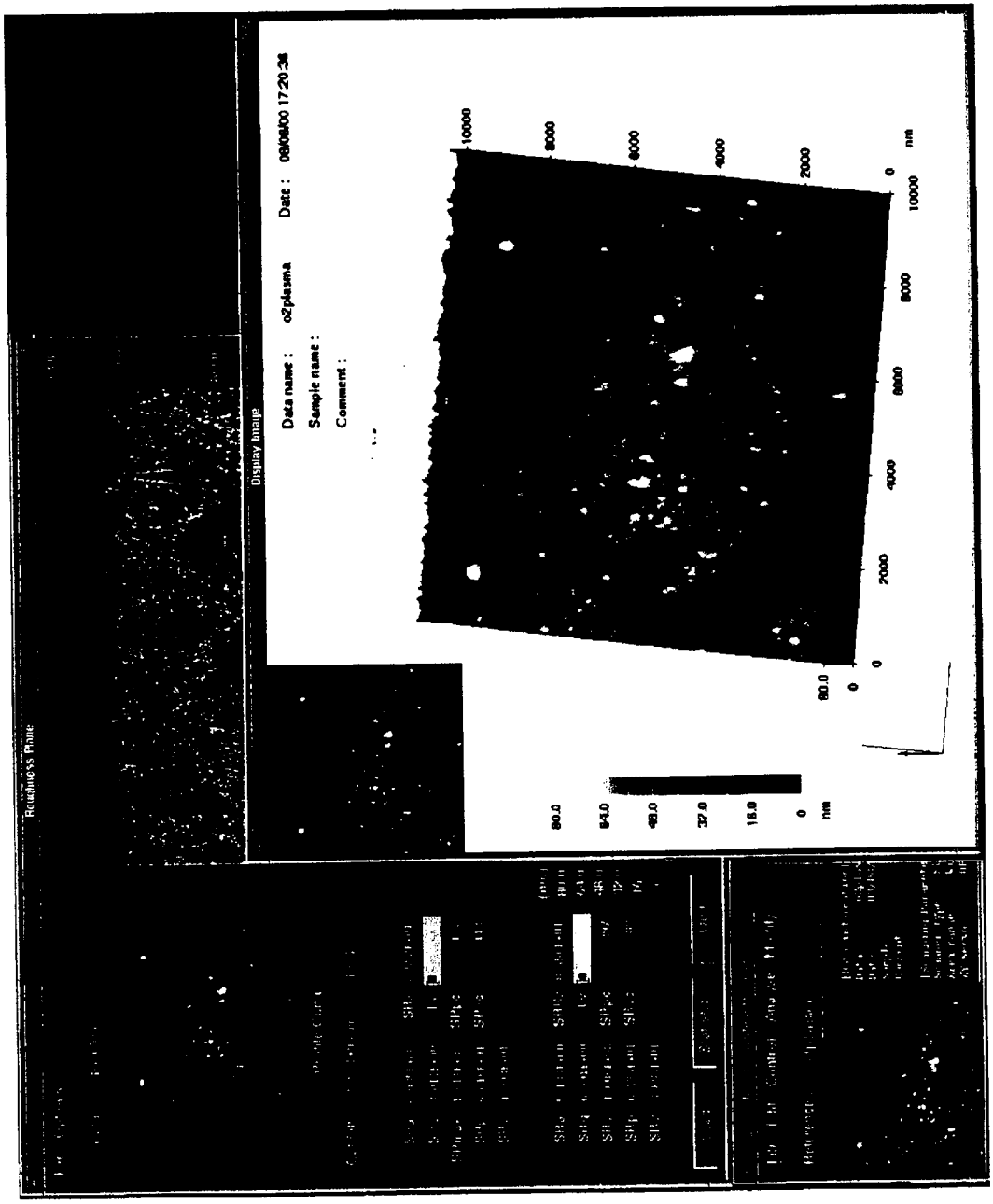
FIG. 19 is an atomic force microscopic image illustrating the changes in the surface of the solder bumps after treatment by a prior art method.

While the average degree of roughening (SRa) of the surface of the solder bumps in the initial state shown in FIG. 18 is 3.512 nm, the average surface roughness (SRa) of the solder bumps after the oxygen plasma treatment shown in FIG. 19 is 5.133 mm. In other words, by using an atomic force microscope, changes of some kind can be recognized in the roughness of the surface of solder bumps that have been treated with oxygen plasma.

In FIG. 19 however, changes are seen partially, that is, on the surface of only the tin component in the solder alloy.

Such a partial change indicates growth of tin oxide resulting from oxidation of the surface of only the tin component by oxygen plasma. In other words, it signifies formation of an oxide film on the surface of solder bumps, whereas the invention under the present application achieves surface roughening.

Surface roughening by an argon-gydrogen plasma treatment according to the invention under the present application, the result of which is shown in FIG. 17 is Such a partial change indicates growth of tin oxide resulting from oxidation of the surface of only the tin component by oxygen plasma. In other words, it signifies formation of an oxide film on the surface of solder bumps, whereas the invention under the present application achieves surface roughening.

Surface roughening by an argon-gydrogen plasma treatment according to the invention under the present application, the result of which is shown in FIG. 17 is different from the oxygen plasma treatment shown in FIG. 19 in that the argon-hydrogen plasma treatment calls for roughening the surface of solder bumps by breaking the oxide film on the surface of the solder bumps so as to expose a new surface of the solder that was under the oxide film.

Thus, while there have been shown, described and pointed fundamental novel features of the invention as applied to a preferred embodiment thereof, it will be understood that various omissions, substitutions, and changes in the form and details of the devices illustrated, and in their operation, may be made by those skilled in the art without departing from the spirit and scope of the invention. For example, it is expressly intended that all combinations of those elements and/or steps which perform substantially the same function, in substantially the same way, to achieve the same results are within the scope of the invention. Substitutions of elements from one described embodiment to another are also fully intended and contemplated. It is also to be understood that the drawings are not necessarily drawn to scale, but they are merely conceptual in nature. It is the intention, therefore, to be limited only as indicated by the scope of the claims appended hereto.

What is claimed is:

1. A bump forming method which comprises the steps of:
   accumulating a soft solder alloy on the surface of a workpiece;
   irradiating the accumulated soft solder alloy with at least plasma containing hydrogen; and
   applying reflow treatment to the soft solder alloy that has been irradiated with at least said hydrogen-containing plasma, thereby forming solder bumps, which will serve as connecting terminals, on the surface of the workpiece.

2. A bump forming method as claimed in claim 1, wherein the hydrogen-containing plasma irradiation and the reflow treatment are performed in a vacuum.

3. A bump forming method as claimed in claim 1, wherein the reflow treatment is performed in either an inert gas atmosphere or a reductive atmosphere.

4. A bump forming method as claimed in claim 1, wherein the irradiating with hydrogen-containing plasma is performed at a temperature lower than the melting point of the soft solder alloy.

5. A bump forming method as claimed in claim 1, wherein the process gas for generating the hydrogen-containing plasma is a mixed gas containing an inert gas and hydrogen gas that contains hydrogen with a mixing ratio of equal to or more than 3 V/V % but less than 8 V/V % calculated in terms of hydrogen molecules.

6. A bump forming method as claimed in claim 1, wherein the duration of the plasma irradiation is limited to less than two minutes.

7. A bump forming method as claimed in claim 1, wherein the reflow treatment is conducted by means of heat radiation in a vacuum.

8. A bump forming method as claimed in claim 1, wherein irradiation with fluorine-containing plasma is performed after the hydrogen-containing plasma irradiation.

9. A bump forming method as claimed in claim 8, wherein the fluorine-containing plasma contains either one of or both argon and oxygen.

10. A bump forming method as claimed in claim 8, wherein the duration and the temperature of irradiation with fluorine-containing plasma are respectively limited to within 60 seconds and a temperature lower than the melting point of the soft solder alloy, the range of permissible temperature including room temperature.

11. A bump forming method as claimed in claim 1, wherein the workpiece is preheated at a temperature not higher than 100° C. when conducting the reflow process.

12. A bump forming method as claimed in claim 1, wherein irradiation with hydrogen-containing plasma is performed again after the reflow process.

13. A soldering method which calls for bringing the soft solder alloy on the surface of a workpiece into contact with the surface of a bonding target, i.e. an object to which said workpiece is intended to be soldered, and thus bonding the surface of the workpiece to the surface of the bonding target by soldering during the reflow process of a bump forming method as claimed in claim 1.

14. A presoldering treatment method which comprises the steps of:
   roughening the surface of solder bumps of a soft solder alloy formed on the surface of a workpiece, and
   forming a layer containing fluorine on the roughened surface of the solder bumps, thereby applying surface reforming treatment to the surface of the solder bumps.

15. A presoldering treatment method as claimed in claim 14, wherein the surface roughening treatment is performed by using plasma excitation of an inert gas to which hydrogen has been added.

16. A presoldering treatment method as claimed in claim 15, wherein the quantity of the hydrogen added ranges from equal to or more than 3 V/V % to less than 8 V/V %.

17. A presoldering treatment method as claimed in claim 15, wherein argon is used as the inert gas.

18. A presoldering treatment method as claimed in claim 14, wherein the surface reforming treatment is performed by using plasma excitation of a mixed gas which contains a fluorine compound or fluorine compounds, and to which either one of or both oxygen and argon are added.

19. A presoldering treatment method as claimed in claim 18, wherein the fluorine compound consists of at least one of the compounds selected from among carbon fluoride compounds, sulfur hexafluoride and nitrogen trifluoride.

20. A soldering method for bonding together a plurality of workpieces by soldering, said soldering method comprising the steps of:
   roughening the surface of solder bumps of a soft solder alloy formed on one or more workpieces;
   forming a layer containing fluorine on the roughened surface of the solder bumps, thereby applying surface reforming treatment to the surface of the solder bumps; and
   bringing said one or more workpieces having the solder bumps that have undergone the surface roughening treatment and the surface reforming treatment into contact with other workpiece or workpieces and, in this state, performing reflow of these workpieces.

21. A soldering method as claimed in claim 20, wherein the surface roughening treatment is performed by using plasma excitation of an inert gas to which hydrogen has been added.

22. A soldering method as claimed in claim 21, wherein the quantity of the hydrogen added ranges from equal to or more than 3 V/V % to less than 8 V/V %.

23. A soldering method as claimed in claim 21, wherein argon is used as the inert gas.

24. A soldering method as claimed in claim 20, wherein the surface reforming treatment is performed by using plasma excitation of a mixed gas which contains a fluorine compound or fluorine compounds, and to which either one of or both oxygen and argon are added.

25. A soldering method as claimed in claim 24, wherein the fluorine compound consists of at least one of the compounds selected from among carbon fluoride compounds, sulfur hexafluoride and nitrogen trifluoride.

26. A presoldering treatment method as claimed in claim 14, wherein the roughening step further comprising the step of:
   mechanically roughening the surface of solder bumps formed on a solder bump plate by means of a roughening member comprising:
   a bumpy surface comprising minute indentations and protrusions disposed on the bumpy surface.

27. A presoldering treatment method as claimed in claim 26, further comprising the step of:
   rolling a roller having a bumpy surface including minute indentations and protrusions disposed on the bumpy surface, which contacts the surface of the solder bumps during movement; the movement includes moving at least one of said roller against the solder bumps and moving the solder bumps against the roller simultaneously flattening and roughening, the surface of the solder bumps by contacting the roller.

28. A presoldering treatment method as claimed in claim 26, further comprising the steps of:

placing a flat plate, having a bumpy surface including minute indentations and protrusions disposed on the bumpy surface, which contact the surface of the solder bumps so the bumpy surface rests on the solder bumps applying a given load to the flat plate so that the surface of the solder bumps is simultaneously flattened and roughened by the flat plate.

29. A presoldering treatment method as claimed in claim 26, further comprising the step of:

placing the solder bump plate on a flat plate having a bumpy surface including minute indentations and protrusions on the bumpy disposed surface, so solder bumps formed on said solder bump plate rest on the bumpy surface of the flat plate, applying a given load to the solder bump plate so that the surface of the solder bumps is simultaneously flattened and roughened by the flat plate.

30. A presoldering treatment method as claimed in claim 29, further comprising the step of:

scratching, rubbing, or scrubbing the solder bump plate while applying a given load to the solder bump plate.

31. A presoldering treatment method as claimed in claim 26, wherein the surface roughening treatment further comprising the step of:

repeating a plurality of roughening actions to the surface of the same solder bumps.

* * * * *